(12) United States Patent
Socher et al.

(10) Patent No.: US 10,389,008 B2
(45) Date of Patent: Aug. 20, 2019

(54) TECHNIQUE FOR IMPROVING EFFICIENCY OF ON-CHIP ANTENNAS

(71) Applicant: Ramot at Tel-Aviv University Ltd., Tel Aviv (IL)

(72) Inventors: Eran Socher, Tel Aviv (IL); Eliezer Halpern, Tel Aviv (IL); Samuel Jameson, Tel Aviv (IL)

(73) Assignee: RAMOT AT TEL-AVIV UNIVERSITY LTD., Tel-Aviv (IL)

( * ) Notice: Subject to any disclaimer, the term of this patent is extended or adjusted under 35 U.S.C. 154(b) by 49 days.

(21) Appl. No.: 15/552,952

(22) PCT Filed: Feb. 25, 2016

(86) PCT No.: PCT/IL2016/050217
§ 371 (c)(1),
(2) Date: Aug. 23, 2017

(87) PCT Pub. No.: WO2016/135730
PCT Pub. Date: Sep. 1, 2016

(65) Prior Publication Data
US 2018/0048048 A1 Feb. 15, 2018

Related U.S. Application Data

(60) Provisional application No. 62/280,215, filed on Jan. 19, 2016, provisional application No. 62/120,995, filed on Feb. 26, 2015.

(51) Int. Cl.
*H01Q 1/22* (2006.01)
*H01Q 1/36* (2006.01)
(Continued)

(52) U.S. Cl.
CPC ............. *H01Q 1/2283* (2013.01); *H01Q 1/36* (2013.01); *H01Q 11/12* (2013.01); *H01Q 13/10* (2013.01);
(Continued)

(58) Field of Classification Search
CPC ...... H01Q 1/2283; H01Q 13/10; H01Q 11/12; H01Q 1/36; H01Q 21/061
(Continued)

(56) References Cited

U.S. PATENT DOCUMENTS 5,845,391 A  12/1998 Bellus et al.
5,952,964 A  9/1999 Chan
(Continued)

FOREIGN PATENT DOCUMENTS

CN    101276693 A    10/2008

OTHER PUBLICATIONS

Lin et al. "A 60GHz digitally controlled RF beamforming array in 65nm CMOS with off-chip antennas", (Jun. 5-7, 2011) 2011 IEEE Radio Frequency Integrated Circuits Symposium, pp. 1-4.
(Continued)

*Primary Examiner* — Brian K Young
(74) *Attorney, Agent, or Firm* — Browdy and Neimark, PLLC

(57) ABSTRACT

Technique for improving efficiency of on-chip antennas, comprising placing each antenna on an individual area on the chip, defined by channels provided in the chip before or after placing the antenna(s). The channels may be metallized. Frequency of a radiating antenna element may be locked by wireless injection locking using a locked subharmonic frequency.

26 Claims, 10 Drawing Sheets

(51) Int. Cl.
*H01Q 21/06* (2006.01)
*H01Q 11/12* (2006.01)
*H01Q 13/10* (2006.01)
*H01Q 23/00* (2006.01)

(52) U.S. Cl.
CPC ... *H01Q 21/061* (2013.01); *H01L 2223/6677* (2013.01); *H01Q 23/00* (2013.01)

(58) Field of Classification Search
USPC .......................................................... 343/700
See application file for complete search history.

(56) References Cited

U.S. PATENT DOCUMENTS

| | | | | |
|---|---|---|---|---|
| 7,437,138 | B1* | 10/2008 | Woo | H04B 1/28 342/357.62 |
| 7,738,841 | B2* | 6/2010 | Ahn | H03K 17/063 455/277.1 |
| 8,547,288 | B2* | 10/2013 | Rietzler | G06K 19/07749 343/795 |
| 8,830,137 | B2* | 9/2014 | Sengupta | H01Q 9/04 343/742 |
| 9,257,751 | B2* | 2/2016 | Felic | H01Q 9/045 |
| 2007/0126648 | A1 | 6/2007 | Svensson et al. | |
| 2008/0236870 | A1 | 10/2008 | Kuwajima et al. | |
| 2011/0063189 | A1 | 3/2011 | Cohen et al. | |
| 2011/0210903 | A1 | 9/2011 | Sarabandi et al. | |
| 2012/0212383 | A1 | 8/2012 | Sengupta et al. | |

OTHER PUBLICATIONS

Jameson et al.,"Sub-harmonic wireless injection locking of a THz CMOS chip array", IEEE Radio Frequency Integrated Circuits Symposium, pp. 115-118 (2015).

Sengupta et al.,"A 0.28 THz Power-Generation and Beam-Steering Array in CMOS Based on Distributed Active Radiators", IEEE Journal of Solid-State Circuits, pp. 3013-3031, vol. 47, No. 12 (Dec. 2012).

Stanikov et al.,"A 0.32 THz FMCW Radar System Based on Low-Cost Lens-Integrated SiGe HBT Front-Ends", Radio Frequency Integrated Circuits Symposium (RFIC) IEEE, pp. 160-163 (Sep. 2013).

Golcuk et al.,"A 0.39-0.44 THz 2×4 Amplifier-Quadrupler Array With Peak EIRP of 3-4 dBm", IEEE Transactions on Microwave Theory and Techniques, pp. 4483-4491, vol. 61, No. 12 (Dec. 2013).

Adnan et al.,A 247-to-263.5GHz VCO with 2.6mW Peak Output Power and 1.14% DC-to-RF Efficiency in 65nm Bulk CMOS, 2014 IEEE International Solid-State Circuits Conference, pp. 262-264 (2014).

Han et al.,A 260GHz Broadband Source with 1.1mW Continuous-Wave Radiated Power and EIRP of 15.7dBm in 65nm CMOS, 2013 IEEE International Solid-State Circuits Conference, pp. 138-140 (2013).

Han et al.,"A 320GHz Phase-Locked Transmitter with 3.3mW Radiated Power and 22.5dBm EIRP for Heterodyne THz Imaging Systems", 2015 IEEE International Solid-State Circuits Conference, pp. 446-448 (2015).

Chen et al.,"A BiCMOS W-Band 2x2 Focal-Plane Array With On-Chip Antenna", IEEE Journal of Solid-State Circuits, pp. 2355-2371, vol. 47, No. 10 (Oct. 2012).

Tousi et al.,"Scalable THz 2D Phased Array with +17dBm of EIRP at 338GHz in 65nm Bulk CMOS", 2014 IEEE International Solid-State Circuits Conference, pp. 258-260 (2014).

Chiang et al.,"A Silicon-Based 0.3 THz Frequency Synthesizer With Wide Locking Range", IEEE Journal of Solid-State Circuits, pp. 2951-2963, vol. 49, No. 12 (Dec. 2014).

Razavi et al.,"A Study of Injection Locking and Pulling in Oscillators", IEEE Journal of Solid-State Circuits, pp. 1415-1424, vol. 39, No. 9 (Sep. 2004).

Yang et al.,"An 8-Element 400 GHz Phased-Array in 45 nm CMOS SOI", Microwave Theory and Techniques IEEE pp. 4241-4249, vol. 64 (May 2015).

Jameson et al.,"High Efficiency 293 GHz Radiating Source in 65 nm CMOS", IEEE Microwave and Wireless Components Letters, pp. 463-465, vol. 24, No. 7 (Jul. 2014).

Babakhani, "A 77-GHz Phased-Array Transceiver With On-Chip a 77-GHz Phased-Array Transceiver With On-Chip", IEEE Journal of Solid-State Circuits, pp. 2795-2806, vol. 41, No. 12 (Dec. 2006).

Chen et al.,"Wireless Synchronization of mm-wave Arrays in 65nm CMOS", Custom Integrated Circuits Conference (CICC) pp. 1-4 (2015).

Tang et al.,"A 2x2 W-Band Reference Time-Shifted Phase-Locked Transmitter Array in 65nm CMOS Technology", Microwave Symposium Digest (IMS), pp. 1-3, (2013).

Steyaert et al.,"A THz Signal Source with Integrated Antenna for Non-Destructive Testing in 28nm bulk CMOS", Proceedings of the A-SSCC 2015, pp. 1-4 (2015).

* cited by examiner

TECHNIQUE FOR IMPROVING EFFICIENCY OF ON-CHIP ANTENNAS

FIELD OF THE INVENTION

The present invention relates to radiating sources, transceivers and other devices comprising antennas, for example to CMOS technology antennas placed on a silicon substrate (chip).

BACKGROUND OF THE INVENTION

CMOS technology innovations over the last decades open the door to the possibility of designing full CMOS integrated systems at THz frequencies. The small antenna size at THz frequencies makes CMOS and silicon attractive for steerable 2D transmitter and receiver arrays. Previous works successfully showed THz source arrays with the use of on-chip antennas [4, 10-13]. However, it is still a challenge implementing such arrays that are frequency and phase locked, with significant radiated power and efficiency in standard CMOS without costly additions. The solution which will be described below aims to solve several existing issues in CMOS THz radiating arrays, for example:

The first issue is antenna efficiency, as is and in an antenna's array. The silicon bulk in standard CMOS has a high permittivity and low resistivity that incurs significant radiation loss at 0.3 THz with bulk thickness of 100-800 µm. If an on-chip antenna is designed upon a grounded silicon substrate (low or high relative permittivity), electromagnetic waves will radiate and propagate out of the antenna in all directions. All the waves radiating inside the substrate will reverberate between the ground-plane and the dielectric/air interface. After few ricochets, the angle of reflection will increase and after a critical angle, the waves will get trapped within the substrate and get coupled to surface waves modes (TE0 and TM1 being the main contributor. Few solutions were developed to circumvent this problem (such as Superstrate Quartz layer, Backside silicon lens), however, they all have a cost, require an external element and complicate the integration of the chip.

Namely, previous works added costly lens with backside radiation [11-12] or a quartz superstrate [13] to keep a reasonable efficiency. Antenna efficiency becomes even more of a challenge for 2D arrays on-chip, since it degrades with the silicon total area, thus making it not scalable. It is also known that antennas' array systems require a large silicon area (being non-proportionally larger than an area required by a single antenna) in order to achieve its maximum gain.

The second challenge is efficient THz generation in each element of such an array. In that sense, a Voltage Controlled Oscillator (VCO) is usually preferable to a multiplier chain due to the DC power consumed especially in power amplifiers. In the ubiquitous cross-coupled pair, there is inevitable tradeoff between its tuning range, output power and phase noise, especially when additional buffers and passive multipliers are used to drive the antenna at harmonics of the generated fundamental.

The third challenge is locking the array. As known in the art, active multiplier chains can be used to lock a signal to a low frequency reference at the cost of significant DC power and area. Individual PLLs can also be used, again with area and power overhead, but also with output power loss due to loading. Subharmonic injection locking can be area and power efficient, but still requires lower (but mm-wave) LO distribution that consumes area, power and do not scale in 2D so easily. It should be noted that locking of THz radiating sources/arrays is a specific technical problem, which is especially acute in the so-called "THz Gap" (0.3 THz-3 THz).

Much effort has been put in recent years to cover the 'THz Gap' by extending the operation range of integrated circuits from millimeter waves toward that THz range (300 GHz-3 THz). It should be noted that above the THz gap, the problem is not so acute since frequencies higher than 3 THz can be served by optical equipment. THz signals are desirable for many applications, but they are limited by their jitter (or phase noise), meaning that their frequency and amplitude are not constant over time. Moreover, current ways for achieving locked THz sources require design complexity, especially when employed in phased-array systems. This is due to several issues, such as: i) LO power distribution loss (splitter) signals (due to the high frequencies), ii) Complexity of Phased-Locked Loops (PLL) and iii) Very high DC power consumption of Active Multiplying Chains (AMC) at such frequencies. Currently, these are overcome at the cost of using expensive technologies, e.g. InP and GaN. Even though THz signal generation and detection have already been demonstrated in a relatively cheap CMOS technology (i.e., in Complementary Metal-Oxide-Semiconductor technology for constructing integrated circuits), various challenges still prevent CMOS technology to become practical for such applications. One important problem is that current CMOS transistors hardly demonstrate any power gain at the THz range beginning from 0.3 Thz (300 GHz, so-called fmax, varies in different CMOS versions). Due to that, signal generation has to rely on harmonic generation of lower frequency (fundamental frequency) sources/transmitters, typically in the mm-wave range. The main challenges in that approach are to achieve high output power, high generation efficiency, high on-chip radiation efficiency and good rejection of the fundamental frequency and other unnecessary harmonics.

Previously known solutions generated J-band (220-325 GHz) signals by using the second harmonic of a D-band frequency source [1], or the third harmonic of a W-band source [2-5]. In the mentioned works, in general, output of the source (usually of an oscillator such as a Voltage Controlled Oscillator VCO) is coupled by a transformer to an antenna, the transformer introducing additional loss but also radiating energy, therefore decreasing the power injected into the antenna. The antenna challenge in that case is not only to radiate efficiently the required harmonic from the interfering silicon substrate of CMOS, but also to reject the fundamental frequency, thus further improving the radiated signal quality and the overall power efficiency. One improvement was demonstrated in [2], where an on-chip loop antenna was directly connected to the VCO transistors' drains. However, to make the on-chip THz radiating source practical, e.g. usable for coherent communication or radar imaging, the frequency and phase of the source need to be locked to a reference source.

One approach is to use a PLL (Phase Locking Loop) at the fundamental [3] frequency, which drastically increases the circuit complexity, cost and DC consumption. Moreover, in case there is an array of radiating sources (VCOs) that approach would require either an individual PLL per element, or a lossy, complicated distribution network for mm-wave or even THz signals.

Another approach known in the prior art was to combine and couple numerous VCOs on the same chip running in parallel and employing mutual locking [2]. In such an approach, however, the VCOs outputs have to be power-combined before the antenna or to provide antennas within each element (VCO) area. The power combination is then carried at the fundamental frequency, which is a disadvantage. Moreover, mutual locking does not necessarily suffice for achieving a locked transmit signal from the overall array; this issue is sometimes dealt with by placing a few synthesizers within the array, in order to injection-lock the overall array, and this solution is again costly, complex and DC consuming. Signal distribution is then done at lower, less lossy, frequencies but the cost in silicon area and the DC power consumption is higher.

A number of publications on the above-discussed subject matter are mentioned in the section "References" presented after the description.

OBJECT AND SUMMARY OF THE INVENTION

It is an object of the invention to solve the above-mentioned several existing issues—efficiency of a single antenna element, efficiency of an antenna array, locking of antenna/array—in a maximally economical way and at least for THz radiating sources and arrays.

It was mentioned, that antennas' array systems require a large silicon area which is much (and non-proportionally) larger than an area required by a single antenna in order to achieve its maximum gain.

To address the first issue of antenna efficiency, the Inventors proposed a concept to conserve/isolate an individual area for an on-chip antenna (being a single antenna element or an antenna element in an antennas' array), from the rest of the silicon area of the chip/area of an insulating board, in order to conserve the gain of the on-chip antenna, by creating channels in silicon substrate of the chip/board, wherein said channels defining the individual area of the antenna, thus isolating the antenna from the rest of the silicon area and/or other antennas of the array. The term antenna chip which will be used in the description and claims should be understood as one or more antennas arranged on an insulating board/chip/die.

To achieve more efficient isolation of the on-chip antenna (from surrounding or from other antennas of the array and their silicon area), the channels in the silicon substrate may be metallized (metal plated, provided with metallic walls embedded in said channels, filled by a conductive material). The on-chip antenna may be a printed antenna, a receiving and/or transmitting antenna, for example a THz antenna. The on-chip antenna may be connected to a transmitter, for example in the form of VCO. The antenna (and the VCO) may be produced by an economic technology such as CMOS or the like.

In the present description, each of the terms "antenna" and "transmitter" can be used in two meanings: specific and general. In the specific meaning, these two terms define a transmitter and an antenna which together may form an antenna element. However, an antenna may be a receiving one, and thus may be not connected to any transmitter/feed. In this case an antenna element comprises the antenna without a transmitter. In the non-specific (general) meaning, either of the terms antenna/transmitter may be used instead of the term "antenna element". A source for radiating frequency (a radiating source) may comprise one or more antenna elements comprising respective transmitters. Two or more antenna elements form an array, they can be called pixels of the array. In the description, the terms radiating source, transmitter, transceiver, antenna, antenna element, array element, array pixel may be used intermittently and should be understood according to the context and with reference to the drawings.

It should be noted, that the channels (metallized or not) may be provided upon placing the array on the board. However, in principle, such channels can be provided in advance, before printing the antennas on the board. Moreover, the channels can be made on the front side of the substrate/board. The individual area is preferably optimal. In the present description, the optimal area can be understood as such an individual area defined by said channels (with or without metallic walls) around a single antenna in an array, within which gain of the single antenna remains non-degraded in operation. The Inventors consider that the effect of gain conservation is a result of neutralizing the action of surface waves which appear on a chip where an antenna or an antennas array is located. It has been noted by the Inventors that if the optimal area, upon being empirically or analytically found for a specific array of specific antennas, is altered (i.e., increased or reduced in size), the gain of the antenna surrounded by such an altered area degrades.

Few technologies such as GaAs or GaN, have the manufacturing feasibility of TSV (Through Substrate Via), which means that a via can go through the entire chip and connect the floor to the top of the chip. Such vias can be manufactured on the front surface of the silicon chip prior to or simultaneously with printing antennas on the chip. Another option is providing a Through-Metal Via (for boards). One possible future implementation of the concept is to use such vias (TSV, TMV) either as are to surround the optimal area of the antenna, or in order to create the mentioned metallic walls surrounding the optimal area. However, such TSV element is unavailable currently in standard silicon technology (for example, CMOS, SiGe) and most probably won't appear before a long time. The Inventors therefore propose a simple immediate solution, which comprises providing diced trenches in the silicon substrate (or chip or board) and then, preferably, plating them or filling them with a conductive glue. In their experiments, the Inventors successfully got the expected effect: they isolated the optimal area of the antenna from the rest of the silicon area and conserved the gain of the on-chip antenna. For example, thanks to the concept and the exemplary developed technique of backside metal plated trenches, the Inventors succeeded to integrate a high gain antenna over any silicon area, conserve its state-of-the-art performance and allow the realization of on-chip antennas array at very low cost with excellent performance. Depth of the channels or depth of the metal walls embedded in the silicon substrate may vary up to the depth maximally allowed by thickness of the substrate.

Actually, the Inventors have also suggested a method of manufacturing an antenna chip, the method comprises a step of providing one or more antenna elements on an insulating board, each being capable of radiating and/or receiving frequency, and a step of providing channels on the insulating board so as to define by said channels a respective individual area for each of said antenna elements. (The insulating board may also be called a chip, silicon substrate, a die, a board, a wafer.)

The antenna chip may be a source of radiating frequency, in this case the antenna element comprises an antenna connected to a transmitter.

As noted, the method may have at least the following versions. An array of two or more antennas may be provided on the board. The channels may be provided in a manner to create optimal individual area/s. The channels may be done at a backside or at a front side of the board. The channels may be made before or after providing the antennas. The backside channels may be further filled by a conductive material so as to provide conductive walls there-inside. The antennas may be manufactured by CMOS or the like technology.

To address the second issue of efficient THz generation in each array element, the Inventors propose using for transmitters of the antennas, for example, a more power efficient VCO topology than a conventional VCO, such as a VCO based on a differential Colpitts topology. Further, the inventors propose directly connecting the VCO with a suitable antenna, thereby providing a modified antenna element. Such an antenna element, manufactured using an inexpensive CMOS technology or the like, forms an efficient THz frequency radiating source. It can be effectively used, for example, in THz antenna arrays. It is therefore proposed an antenna element comprising a transmitter having a VCO topology, directly connected to an antenna. The transmitter may have a Colpitts VCO topology. More specifically, the antenna element may be a CMOS manufactured, THz frequency antenna element. The antenna element may be in the form of the proposed antenna chip.

To address the third challenge of locking the array, the Inventors propose a new approach, namely a so-called wireless subharmonic injection locking (schematically depicted in FIG. 1c and then illustrated and explained in other Figures, for example in FIGS. 1b, 6b, 6c), especially advantageous for an antenna and an antennas' array operating at THz frequencies. Actually, all the mentioned challenges bring together a further aspect of the present invention. The invention provides a cost effective technique of a radiating source—for example operating in THz frequency and/or in the frequency range called "THz Gap"—, producing a robust frequency locked signal. In the prior art, it was considered impossible to build the transmitters (i.e., THz antenna elements) of interest by using a conventional, relatively inexpensive technique such as CMOS or the like (for example boards/packages of BT, FR4 etc.)

Actually, the approach proposed by the Inventors for locking an antenna element, includes providing a suitable transmitter with a THz antenna, and performing a wireless, external injection locking of the transmitter by using a subharmonic frequency of a desired transmitting THz frequency, thereby obtaining also the desired, locked transmitting THz frequency of the transmitter.

In more details, for locking a THz signal (for example, a "THz gap" signal) produced by a transmitter, the Inventors propose the following steps:
  providing the transmitter with an antenna capable of transmitting a desired THz signal into free-space and adapted to receive a subharmonic frequency of that signal; (THz/THz gap transmitter, depending on the required radiated frequency)
  providing an external, remote radiating source for wirelessly locking the THz transmitter,
  providing a locking beam, radiated from the above-mentioned source at a locked (jitter-free) frequency being subharmonic with respect to the desired transmitting frequency of the THz transmitter, and ensuring that the radiated beam spatially encompasses the THz transmitter (possibly, an array of such transmitters or at least the majority of transmitters in the array), thus locking the transmitter(s) to a subharmonic frequency of the THz transmitter(s) and consequently locking the transmitting frequency of the THz transmitter(s).

Indeed, it has been shown by the Inventors that the transmitting frequency of the transmitter(s) will be locked too, due to locking of its/their sub-harmonic frequency.

The transmitter may be a Voltage Controlled Oscillator (VCO) fed by a DC supplying scheme. For the required transmitting and receiving capabilities, it may be provided with a suitable THz antenna. For example, the THz antenna may be in the form of an on-chip antenna. The VCO may be manufactured using a CMOS technology, for example using CMOS 65 nm. The antenna may also be CMOS-based, or alternatively—manufactured by any of the SiGe, InP, HEMT technologies. The antenna preferably forms part of a common integrated circuit (IC) with the transmitter. The CMOS transmitter in the form of a Voltage Controlled Oscillator (VCO) may be directly connected to the on-chip antenna (for example, via the VCO transistors drains).

In an array comprising multiple similar transmitters, the transmitter coupled with the antenna will be called an element of the array. In the frame of the present description, the mentioned transmitter of interest may sometimes be called a first transmitter or a transceiver. The external source may sometimes be called a second transmitter.

In the context of the present patent application, the term "frequency" should be understood as frequency of an electromagnetic signal, which signal may either be inputted to or outputted from a transceiver/transmitter.

The term "locked frequency" should be understood as a signal having frequency which is locked at a specific frequency value (i.e. is free of jitter).

It should be noted that, both in general and in particular, the proposed transmitter may be capable of simultaneously:
generating a fundamental frequency,
receiving a locking subharmonic frequency of the fundamental frequency, and
producing and transmitting a superharmonic frequency in respect of the locking frequency.
It is thus understood that said superharmonic frequency may be the fundamental frequency or a higher harmonic of the fundamental frequency, and remains superharmonic with respect to the mentioned subharmonic (locking) frequency.

The solution proposed by the Inventors may therefore be formulated also as a method suitable for locking a THz signal (for example, a THz gap signal) produced by a transmitter, comprising:
  providing a transmitter capable of a) generating at least a first frequency of N THz, b) receiving a second frequency of N/n THz, wherein n is natural; c) transmitting at least a third frequency being higher or equal to said first frequency;
  providing an external source capable of emitting a locked frequency of N/n THz being equal to the second frequency of the transmitter;
  initiating the transmitter and the source, while exposing the transmitter to radiation of the source so as to perform wireless injection locking of the transmitter by using its second frequency of N/n THz, thereby locking also said third frequency;
  outputting, from the transmitter, said third locked frequency being the transmitting frequency.

For example, the first frequency may be the fundamental frequency and the second frequency may be a subharmonic frequency of the transmitter. The subharmonic case is preferred, since it is more easily derived from the present-day instruments. The third frequency may be either the transmitter's superharmonic frequency, or its fundamental frequency. Alternatively, the first frequency may be a superharmonic transmitting frequency of the transmitter, while the second frequency may be either the fundamental or a subharmonic frequency of the transmitter. Preferably in this description, the third/first frequency is used for transmitting information via an output signal of the first transmitter, while the second frequency is used for controlling (locking) phase and frequency of various signals of the first transmitter.

Further, the method may comprise taking measures for blocking frequencies other than said second frequency from entering the transmitter (transceiver). To perform that, the measures may comprise:

a) making the antenna of the transmitter narrowband, adapted to pass only said second frequency; b) performing a specific modulation to the locked second frequency of the source, and adapting the antenna of the transmitter to pass only the frequency having that specific modulation.

In yet a further version, the method comprises simultaneously outputting, from the transmitter, also the second locked frequency (say, for mutual locking of neighbor transmitters in an array, which will be described later below). It should be noted that in such an array, many transmitting frequencies may theoretically co-exist. Each element in the array may be designed to produce its own transmitting frequency, but may use one and the same second frequency for external and/or mutual locking. In the frame of the present description, we mainly discuss and illustrate the transmitter/array which transmits a single frequency.

In the mentioned further version of the method, it comprises adapting the antenna of the transmitter for: transmitting the first frequency N THz for carrying information, receiving the second frequency N/n THz for wireless injection locking of the transmitter, transmitting the second frequency N/n THz for wireless injection locking of one or more of neighbor transmitters in a transmitters array. As mentioned, the transmitters array may be formed by providing at least one additional transmitter similar to said transmitter and located in vicinity to said first transmitter. There may be then performed mutual wireless injection locking between neighboring transmitters of the transmitters array, by using the second locked frequency from at least one transmitter of the array. In one preferred version of the method, it comprises combining the mutual locking and the external locking in the transmitters array, thereby obtaining high EIRP Effective Isotropic Radiated Power), TRP (Total Radiated Power), low DC (Direct Current) consumption, and minor circuit complexity.

There is an additional option to improve capabilities of the proposed solution, when used in an array of similar elements. The phases of transmitted signals from different transmitters (VCO elements) of the array are usually not the same. The Inventors have shown that spatial steering of the overall emanating beam of the array can be performed simply by adjusting the relative phases of the elements, which can be done by adjusting so-called DC working point(s) of the VCOs.

It is known that any VCO produces a jittering, or unlocked signal; moreover, CMOS VCO was previously considered unsuitable for locking THz band frequencies. The Inventors declare that surprisingly, the proposed method allows effectively locking the THz gap transmitting frequencies of such a CMOS-based (e.g. 65 nm CMOS-based) VCO and overcoming the drawbacks presently intrinsic for the CMOS based transmitters at the THz gap.

For example, the use of a subharmonic frequency of a CMOS-based transmitter/VCO allows working in the range of frequencies lower than fmax of VCO (i.e., the maximal frequency at which VCO still provides Gain), thereby the proposed solution does not suffer from the absence of transmitter Gain at frequencies higher than fmax.

Further, the Inventors utilize the phenomenon of injection locking in a novel, wireless way. Namely, they use quite a low power, subharmonic frequency locking signal from a remote source working in free space, and surprisingly obtain a robust transmitting source with a locked THz gap frequency, which does not require expensive and bulky PLL circuits and/or multiplying schemes has very low DC power consumption.

The newly proposed technology has been defined above in terms of the method. Definitions of the proposed system and of the suitable antenna generally correspond to the definition/s of the method. Still, some specific features and details will be added in the summary and in the detailed description below.

According to a further aspect of the invention, there is provided a system capable of locking a signal of THz transmitting frequency, the system comprises a transmitter with a THz antenna adapted to receive a locked subharmonic frequency radiated from an external radiation source, the system being adapted to perform wireless injection locking in said transmitter by said locked frequency being subharmonic in respect of the transmitting THz frequency of the transmitter; the system thereby ensures locking of said transmitting THz frequency of said transmitter.

In one preferred embodiment, the above system is adapted for producing and locking the transmitting frequency being a THz gap frequency. The system may also comprise the external source of the locked subharmonic frequency, capable of radiating said transmitter.

In more details, the system may comprise:

the transmitter provided with the THz antenna and being capable of: producing at least a first frequency of N THz, receiving a second (subharmonic) frequency of N/n THz, wherein n is natural, transmitting a third frequency being equal to or higher than the first frequency;

an external source capable of emitting a locked frequency of N/n THz being equal to the second frequency of the transmitter;

the transmitter and the source being arranged in space so that whenever being initiated, the transmitter is exposed to radiation of the source, and thus is subjected to wireless injection locking at its second frequency of N/n THz, thereby one or more frequencies of the transmitter become locked due to the locked second frequency; the first transmitter is thereby enabled to output at least said third locked frequency being said transmitting frequency.

As already mentioned, the transmitter may be a VCO, for example a CMOS VCO, and the THz antenna may be an on-chip ring (loop) antenna directly connected to the VCO. The antenna may be manufactured by the CMOS technology, but may be produced by another technology and combined with a CMOS VCO in the same integrated circuit.

In one preferred embodiment of the proposed system, the transmitters array and the external source may be adapted to perform a combination of mutual and external injection locking.

The external source may be any source capable of emitting and locking the second frequency, preferably positioned of about 6-50 cm away from the transmitter. However, depending on the specific design and parameters of the antenna and the array, the antenna may be located up to 10 m away from the array. Power from the external locking source can be as low as −30 dBm.

As already mentioned, the proposed concept also enables building and using simple and cost effective locked THz transmitter arrays, for obtaining combined, more powerful and jitter—free output signals.

A distance between adjacent transmitters in said array may be in the range of about (0.5-2.0) of the fundamental frequency wavelength, for example of about 1 mm-3 mm for 100 GHz. The mentioned distance range may serve as an exemplary range characterizing dimensions of the individual areas for transmitters in arrays, as was discussed above.

The transmitters array may be composed of similar CMOS VCOs, and some possible modifications of the transmitters, antennas and arrays will be described below in the detailed description.

As mentioned, there is also provided a THz frequency antenna element manufactured by a CMOS technology, comprising a transmitter having a VCO topology and being directly connected to an antenna. The antenna element may be in the form of the proposed antenna chip. Further, the antenna element may be adapted for the proposed subharmonic wireless injection locking.

The antenna element may be used, for example, in the above-discussed system and be adapted at least for a two-fold function comprising:
  receiving a subharmonic frequency for performing wireless injection locking of the transmitter;
  transmitting a working frequency being a superharmonic working frequency with respect to the mentioned subharmonic locked frequency.

The antenna may be further adapted for a three-fold function, the additional function being transmitting a subharmonic locked frequency for performing wireless injection locking of neighboring transceivers, if any.

The subharmonic frequency may be a fundamental frequency of the transmitter or its lower harmonic frequency; while the superharmonic frequency may be a fundamental or a higher harmonic frequency with respect to the mentioned subharmonic frequency, respectively.

Currently, the power which can be provided by the antenna at the transmitting (working) frequency appears to be sufficient for example, for concealed-weapon radars (namely short-range radars), extreme wide bandwidth communications at short ranges, and imaging of biological tissues.

Power from the external locking source can be as low as −30 dBm for neighboring antenna elements (transceivers, 'elements', pixels) of the array spaced by of about half-wavelength, which is around 1 mm. The distance can be also smaller, depending on a specific need.

The subharmonic frequency may be understood as the second frequency, while the superharmonic frequency may be understood as the first or the third frequency as described above.

Preferably, the antenna is adapted for transmitting THz gap frequencies. In the receiving mode, the antenna may be adapted to frequencies below the THz gap, which is even more economic (for example, instrumentation-accessible frequencies may be up to 100 GHz).

More specifically, the proposed antenna may be a ring-like on-chip antenna. As mentioned, it may be a CMOS-based antenna, but may also be not.

Preferably, the antenna of the antenna element may be adapted to work in the following two regimes depending on the frequency:

at the subharmonic frequency (for example at 115 GHz), the antenna is an inductor (impedance load) and acts as an RF-choke at a fundamental frequency of the transmitter;
  at the transmitting frequency (for example at 345 GHz) the antenna works as a matched resistive antenna.

Naturally, in a further version of the method and in further embodiments of the system, a single antenna element or an array of such elements may be manufactured on an insulating board (PCB, die, chip, silicon substrate) having channels defining individual areas for antenna element(s) for isolating the antenna elements from one another. The channels may be metallized.

Similarly, the above-proposed solution for isolation of antenna element(s) by channels provided in the insulating board, may be fulfilled by ensuring wireless injection locking of the antenna element(s).

Any of the ideas may use the antenna element comprising a VCO transmitter directly connected to an antenna, for example a CMOS THz antenna element.

For example, the following exemplary solutions may be proposed: The discussed antenna chip (comprising a chip with one or more antenna elements isolated by channels provided in the chip), having at least one of the following features a) and b):
  a) the antenna element is a THz frequency antenna element manufactured by a CMOS technology and comprising an antenna directly connected to a transmitter having a VCO topology;
  b) the antenna element comprising a transmitter connected to an antenna, wherein said antenna element is capable of performing a wireless injection locking of its transmitter by using an external locked frequency being subharmonic of a desired THz transmitting frequency of the transmitter, thereby obtaining said THz transmitting frequency locked.

The discussed method for locking signals of THz frequency may be performed in the antennas chip being a radiating source, where the antenna element (intended for radiating the necessary THz frequency) is placed on an insulating board within an individual area which is defined by channels provided in the insulating board.

The above method may further comprise providing an external source of locked frequency and ensuring that dimensions of the mentioned individual area approximately correspond to cross-section of a beam radiated by said external source, while received at the individual area.

The system intended for locking a signal of THz transmitting frequency may comprise one or more of the mentioned antenna elements placed within individual area(s) defined on an insulating board by channels (dices, trenches) provided in it.

The invention will be further described in more details while the description proceeds.

BRIEF DESCRIPTION OF THE DRAWINGS

The invention will be explained and illustrated below, with the aid of the following non-limiting drawings in which:

FIG. 1c also depicts that antennas of the array are wirelessly lockable according to the invention.

FIGS. 5a and 5b give exemplary dimensions of the array and the trenches.

DETAILED DESCRIPTION OF SPECIFIC EMBODIMENTS

The proposed new approach comprises mechanical/electrical isolation of any antenna elements in an array and locking transmitting frequencies of antenna elements comprising transmitters, performed separately or together. While being useful for any technologies and frequencies, the approach is especially advantageous for technologies such as CD, SIGE, for all CMOS process nodes (for example, 65 nm CMOS). The approach achieves significant increase of radiated power for an on-chip array of antennas. For example, impressive results are obtained for arrays working in a frequency window around the THz gap, i.e. within and around the range of 300 GHz-3 THz.

For the detailed description, we will remind on the following terminology:
W-band frequency: 67 GHz to 110 GHz
J-band frequency: 220-325 GHz
D-band frequency—110 GHz to 170 GHz
THz Gap frequency—approximately between 0.3 THz and 3 THz.
EIRP—Equivalent Isotopically Radiated Power
TRP—Total Radiated Power
directivity of array—directivity of combined beam of an array, measured at far-field
DC consumption: DC power, measured as DC voltage to transistors' drains multiplied by DC current through transistors' drains.
Locking range—the frequency range, in which a VCO is jitter-free, meaning it is directly influenced by injection signal. In this range, the VCO's frequency can be adjusted (i.e. the frequency of the VCO will track, or equal to that of the injecting signal)
Q of the tank—quality factor of the resonant tank of the oscillator (VCO)
ESD protection—Electrostatic Discharge protection against ESD shock;
An antenna element comprises at least an antenna (for example, a receiving antenna). Transmitter/transceiver being provided with a suitable antenna forms a radiating antenna element.
Source for radiation frequency (radiating source) may comprise one or more antenna elements comprising transmitter(s).
Two or more antenna elements, placed on an insulating board (for example, on a silicon substrate), form an array.
Antenna element, especially as part of an array, may be called "pixel", "transmitter" or "antenna"
VCO—Voltage Controlled Oscillator
Antenna chip—an insulating board carrying one or more antennas
Trench—channel/dice/slot provided in an insulating board/silicone substrate FIGS. 1a-c illustrate a combined concept demonstrated by a Low cost 2D scalable wirelessly locked THz antennas' array.

Figure 1A:
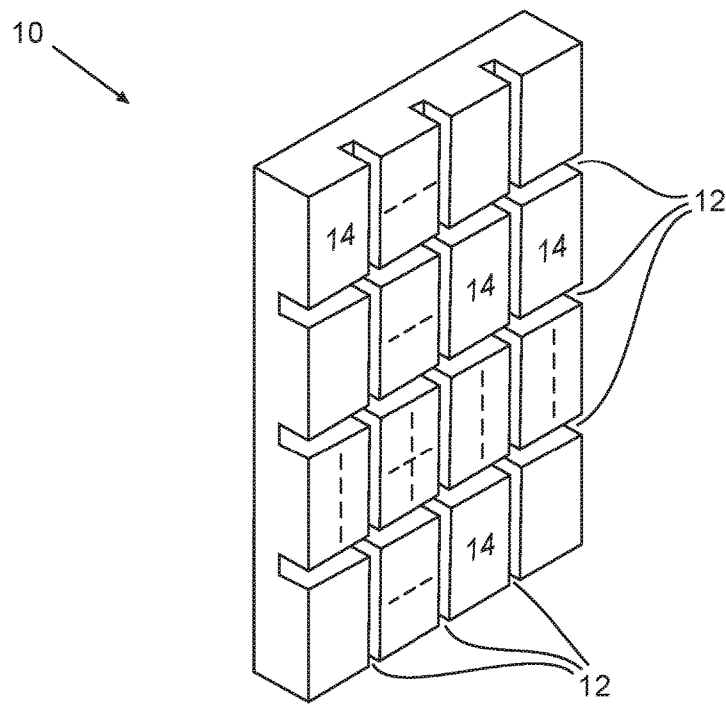
FIG. 1a shows an insulation board that carries a net of channels (such as trenches or dices) provided in the board and separating it into individual areas for antennas of a 2D array.

FIG. 1a shows an exemplary implementation of an insulating board/silicon substrate/die 10 intended for a low cost 2D scalable antennas' array. On the board 10, individual areas 14 for the antennas (antenna elements, transmitters, sources, pixels) 16 (shown in FIGS. 1b, 1c) are separated by channels/trenches 12 provided at the back surface of the substrate 10. In practice, the backside of the insulating board can be diced (as shown), after manufacturing of the array on the front surface of the board (so-called post manufacturing process). Alternatively, the channels 12 can be made on the front-side of the substrate, and in advance. As has been shown by the Inventors, any channels within the antenna substrate (CMOS or else) will serve the purpose of conserving antenna gain. Channels can be either diced after antenna printing, or trenched prior to the antenna printing on CMOS or board by a process called Through-Silicon-Via (for CMOS/silicon substrates) or Through-Metal-Via (for boards/packages like BT, FR4 etc).

Figure 1B:
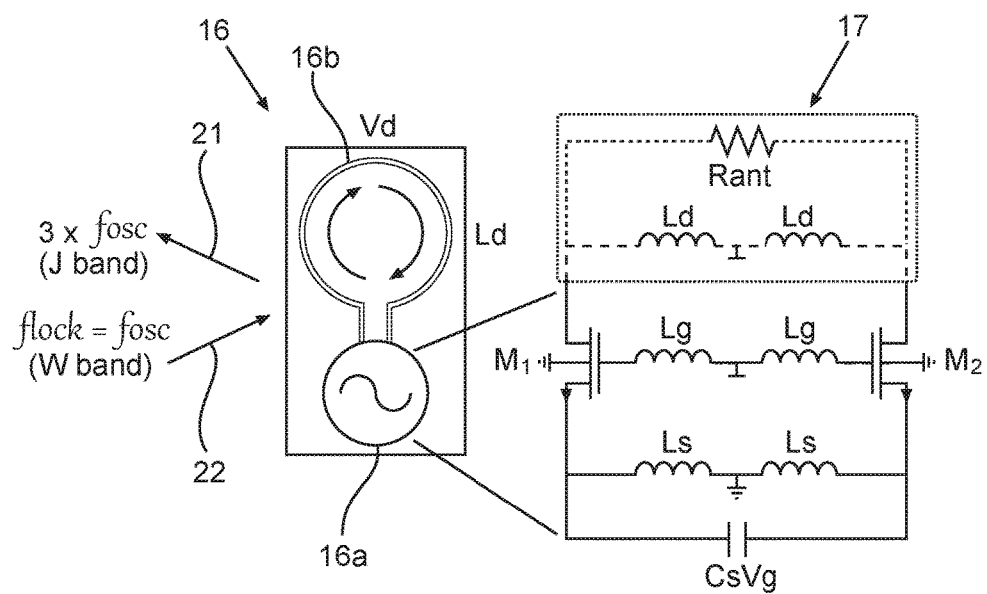
FIG. 1b shows an example of implementation of a radiating source as an antenna element comprising a transmitter, which may be used as a pixel of a radiating array.
Figure 1C:
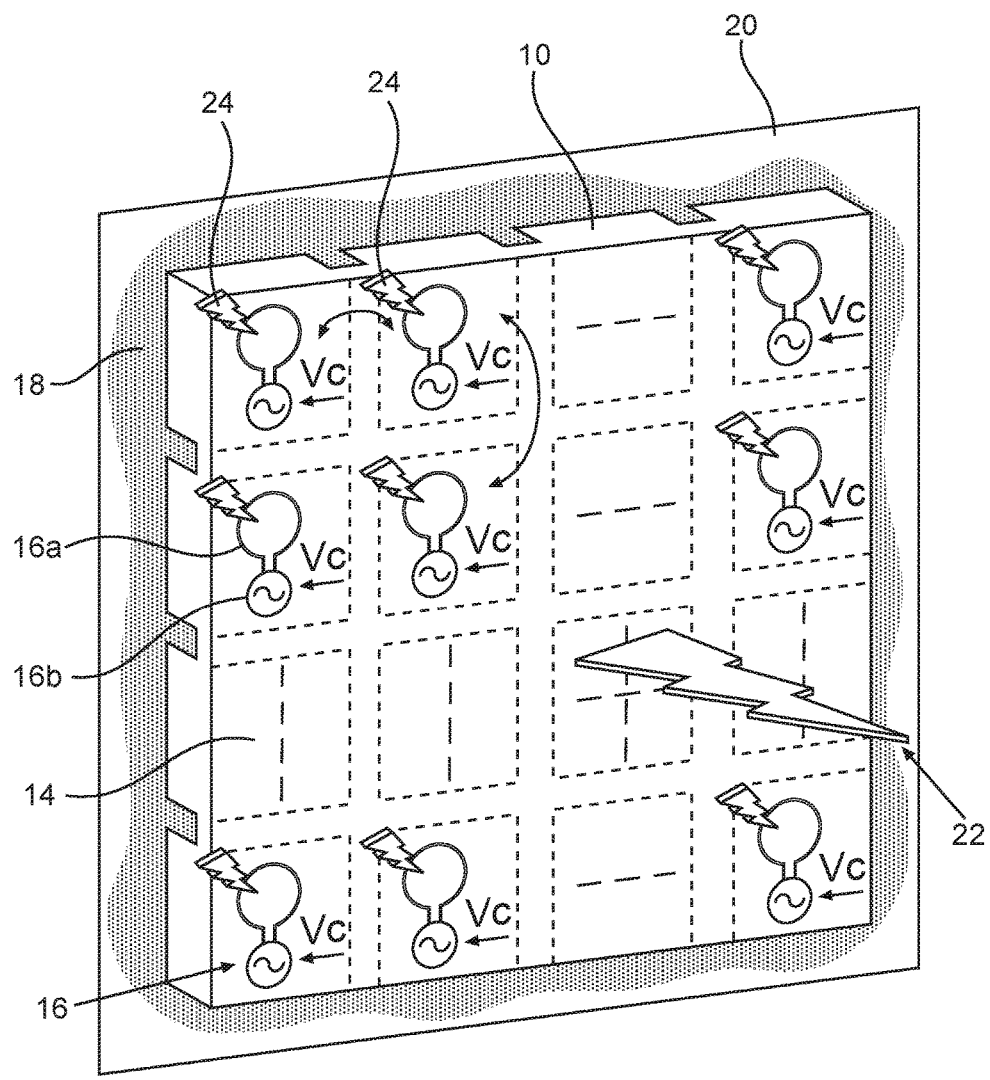
FIG. 1c shows an exemplary implementation of a low cost 2D scalable THz Array, where antenna elements are separated by the trenches/dices provided in the silicon substrate.

FIG. 1b is a schematic illustration and a model of one proposed topology of a single radiating source (antenna element, pixel) 16. In this example, it is based on a THz transmitter VCO 16a coupled with a THz antenna 16b, both manufactured by CMOS The antenna is for example a loop antenna which already proved its excellent properties according to the previous work [14] of the Inventors. VCO in FIG. 1b is of the Colpitts configuration. The Inventors proposed to connect the transmitter directly to the antenna, to separate VCOs in the array and to perform wireless injection locking (see FIG. 1c, and also FIGS. 6b, 6c). In the antennas' model (dotted contour marked 17), the upper branch comprising a virtual resistance Rant corresponds to frequency 300-345 GHz ($3^{rd}$ Harmonic), while the branch with two virtual inductivities Ld corresponds to the 100-115 GHz (Fundamental harmonic), both harmonics being generated by the VCO. The transistors isolate the tank of their $L_g$ and $C_{gs}$ from the antenna that loads the drains. Tuning is achieved by gate biasing that controls $C_{gs}$ without adding a low Q varactor. The relatively high Q of the effective tank and the absence of a tail current enables fundamental voltage amplitudes exceeding $2V_{dd}$. These exemplary amplitudes enable very efficient $3^{rd}$ harmonic current generation in the transistors, driving the loop antenna connected directly to the drains. Other amplitudes may bring efficient generation of another (for example, of $5^{th}$) harmonic. The special design of the loop antenna comes again into play: it is an RF inductive choke at the fundamental frequency but resistive, for example, at the radiated $3^{rd}$ harmonic. Therefore, there is hardly any power generated at the fundamental frequency, let alone radiated, and very efficient generation and radiation at the $3^{rd}$ harmonic. It has been found by the Inventors, that it is a) possible and b) advantageous to use a sub-harmonic external radiating source, in order to wirelessly lock the radiated output frequency of a THz transmitter. The locking phenomenon in VCO takes place due to a sufficiently large open-circuit voltage at the antenna node (in receiving mode) connected to the transistors Drains of first transmitter (i.e., directly). In operation, the parasitic capacitances of capacitors connected between gate and drain (Cgd) and drain and source (Cds) provide current path to a so-called resonant/oscillation tank between the Gate and the Source at the fundamental frequency of the VCO. Computer simulations take into account specific parameters and for example, show that the open-circuit voltage of the antenna, radiated with incident power of −20 dBm is around 3 mV rms around 110 GHz. This corresponds to a locking range of −0.3 GHz at the fundamental frequency, as observed in simulation, as well as predicted by Adler's equation of the locking range $\omega_L$, taking into account the simulated oscillation and injected amplitudes in the tank:

$$\omega_L = \frac{\omega_0}{2Q} \frac{V_{inj}}{V_{osc}}$$

where $V_{inj}$ is the injected voltage (at 110 GHz), $V_{osc}$ is the oscillation voltage, Q is taken as 25, $\omega_0$ is the oscillation frequency taken at 110 GHz and the resulting locking range is ~0.2 GHz.

FIG. 1b, inter alia, schematically shows one proposed way of locking of a single on-chip J-band radiating source 16. The source is based on a fundamental W-band VCO that radiates its J-band 3-rd harmonic $3 \times f_{osc}$ (21) using an on-chip loop antenna, connected directly to the differential VCO without a buffer. Radiating the chip with a W-band signal 22 $f_{lock} = f_{osc}$ (for example, using a horn antenna located 50 cm away), enables wireless injection locking of the radiating source 16. The source can be tuned in a wide frequency range between of about 280 and of about 294 GHz with peak total radiated power of about 0.6 mW, EIRP of about +7 dBm and DC to THz radiated power efficiency of about 3%.

With a free-running phase noise of better than −95 dBc/Hz at 10 MHz offset, the locked signal follows the phase noise of the external reference up to a locking range around 80 MHz with −25 dBm of radiated W-band power. In a slightly different example of the radiating source (transmitter) of FIG. 1b, the circuit may be designed in a TSMC (Taiwan Semiconductor Manufacturing Co) CMOS 65 nm process, on a 230 μm thickness bulk (without channels) bearing resistivity of 10 Ω·cm. The VCO 16a is based on a differential Colpitts voltage controlled oscillator (VCO).

The VCO tank is composed of a nested loop LS and a MOM capacitor CS at the source of the transistors, the frequency tuning is achieved by controlling the transistor Gate bias (modifying the transistor Gate-Source capacitance and therefore the oscillation frequency). The loop (ring) antenna 16b is connected directly to the transistor drain and is designed so that its ring is an inductor and plays the role of an RF-choke at the VCO fundamental oscillation frequency (say 100-115 GHz) and at the 3rd harmonic (300-345 GHz) of the oscillation frequency the loop/ring becomes an almost purely resistive element, acting therefore as a J-band, matched resistive loop antenna. Decoupling capacitors and ESD protection formed by N-type diodes were added at each bias node in the circuit. A 1 KΩ resistor was added in series to the transistor gate as an additional ESD protection.

The maximum simulated injected power into the antenna is about 0 dBm and the VCO simulated tuning range is about 5%. The antenna, simulated by a computer simulation program, has a −10 dB bandwidth of 21% (260-320 GHz) and directivity and total efficiency above +8 dBi and 50% respectively, from 270 GHz to 320 GHz.

VCO operation. As mentioned, the VCO tank is composed of a nested loop LS and a MOM capacitor CS at the Source of the transistors. However, the main capacitor and inductor which determine the oscillation frequency of the VCO are the CGS Gate-Source capacitor and the Gate nested loop inductor LG. Therefore, the frequency tuning is achieved by controlling the transistor Gate bias (modifying the transistor Gate-Source capacitance and therefore the oscillation frequency). The inductor Ls merely needs to be large enough to ensure the oscillation stability, while a proper ratio between the transistor dimensions, Gate inductor LG and Source capacitor CS will maximize the tuning range. The passive elements (inductors and source capacitor) are fixed in value and are determined in the design. Same goes to the dimensions of the transistor. However, the DC value of Vg, changes effectively the transistor's gate-source capacitance, which, in turn, changes the free-running oscillation frequency.

The VCO was designed in simulation to have its fundamental oscillation frequency centered at 110 GHz. The simulated maximum differential output power at the transistors drains is 0 dBm at 330 GHz and the simulated tuning range is 1%. Decoupling capacitors and ESD protection (formed by N-type diodes) were added at each bias input of the circuit. A 1 KΩ resistor was added in series to the transistor Gate as an additional ESD protection.

The fact that the VCO is directly connected to the antenna is novel and fruitful, alongside with the multi-functionality of the antenna and, of course, with the use of an external locking source for injection locking.

FIG. 1c schematically shows an exemplary antennas' array formed from elements 16 shown in FIG. 1b, placed on the substrate 10 shown in FIG. 1a. In other words, pixels of the array may be THz CMOS radiating sources. Further, FIG. 1c schematically illustrates that trenches 12 formed in the substrate to isolate elements of the array, can be metal filled. For example, it can be performed by placing the back side of the substrate 10 onto a layer of conductive glue 18 on a board (PCB) 20. FIG. 1c also shows that so-called wireless injection locking can be performed on the antenna's array (using for example a 100 GHz external reference, symbolically marked 22). It should be noted, however, that the antenna's array may be placed on an insulating board not having the above-mentioned channels.

If such an array is subjected to a locking frequency using 22, the wireless injection locking will anyway take place, but will be less efficient due to interference of non-isolated antennas of the array. In any configuration of the insulating board, the injection-locking process may be two-fold: first, neighboring elements in the array injection lock each other (arrows 24); then, an external 100 GHz source 22 (not shown in FIG. 1c) locks the entire array to a reference. We use a value of 100 GHz in this example, though it may actually be 115 GHz or the like. Loop antennas may play an important role here as well. Even though the fundamental 100 GHz is not radiated by the antennas, it generates a magnetic field in the loop, which is inductive at 100 GHz. This signal is magnetically coupled into the neighboring loop antennas and injected into the VCO tank through the transistor $r_{ds}$ and $C_{gd}$. The external 100 GHz locking source has no impact on the 300 GHz (three-fold 100 GHz) radiated power and could easily be implemented in CMOS as well with an output power of just −15 dBm.

It has been successfully demonstrated by the Inventors that the high gain property of antennas in arrays can be achieved for frequencies around 270-350 GHz. However, a similar effect can be realized over a much larger frequency spectrum (at least 200-700 GHz, according to first results of the current research). Below, there is presented a more detailed description of an antennas array intended for injection locking and created on a substrate with or without dividing it into individual areas by the above-described channels. Numerous VCOs may be combined and coupled into an array on the same chip, may run in parallel and employ mutual locking. The proposed new way of locking a radiating J-band source may be used in the array. To check it, a VCO with a free-space running radiating THz source was realized and its free-running signal was successfully observed and measured. The measured output signal of one THz source demonstrated a maximum EIRP of +3.8 dBm at 345 GHz, with a tuning range of 1.2% between 343 and 347 GHz. By using a reference signal from an external D-band source and radiating it in the direction of the free-running THz radiating chip array at a frequency close to its fundamental oscillation frequency, the 3rd harmonic radiating source array signal was successfully locked at THz frequencies.

Arrays of 1×2 and 1×4 sources were realized and EIRP improvements of 5 and 10 dB, respectively, were measured, resulting in a +8.6 dBm/+13.8 dBm EIRP for the 1×2/1×4 arrays. The TRP (total radiated power) of the 1×4 array is +1 dBm, resulting in a DC-to-THz efficiency of 1.2%.

The above-mentioned parameters of the proposed transmitter are much better (by around an order of magnitude), compared to other CMOS nodes (e.g. 45 nm etc.). Also, they beat other approaches for THz radiation production than VCO+Antenna, e.g. multiplying chains and VCO+PLL+Antenna. A circuit similar to that of FIG. 1c (but without channels 12) was designed in a TSMC CMOS 65 nm process, with a 230 µm thick silicon bulk, bearing a resistivity of 12 Ω·cm. In the example, each element of the array is based on a differential Colpitts voltage controlled oscillator (VCO).

The on-chip ring antenna of each VCO of FIG. 1c can be similar to the antenna in FIG. 1b. It should be noted that the mutual injection locking is not mandatory for the proposed solution (though helpful). The closeness of the elements gives three things: i) the beam of the external 'locker' can be narrow, and still encompass all elements. ii) beam steering can be done more easily, since close elements interact easily at free-space. iii) the directivity of the entire radiated beam is increased as the elements are closer.

Still, dividing the silicon area of the array into individual areas 14 of the array pixels brings additional advantages, like stabilizing Gain of one transmitter/pixel of an array, and stabilizing & increasing Gain of the array with reference to the Gain achieved without the separated individual areas To summarize, FIGS. 1a-1c schematically present and illustrate two inter-related concepts of the present invention: isolating antenna elements in an array and wirelessly locking thereof for more effective operation. It is shown by an exemplary implementation comprising wirelessly-locked 0.3 THz 2×3 radiating source array in 65 nm CMOS. As mentioned, the wireless injection locking of the array can be achieved at a usual insulating board/die (without the mentioned channels). However, by using post-processing metallized (metal plated) diced trenches at the die backside, a TRP of +5.4 dBm and EIRP of +22 dBm with 5.1% radiated DC-to-THz efficiency was achieved. The achieved radiated power and efficiency in this locked source should be seen as a record (an achievement) for integrated circuits of any technology above 200 GHz.

Figure 2A:
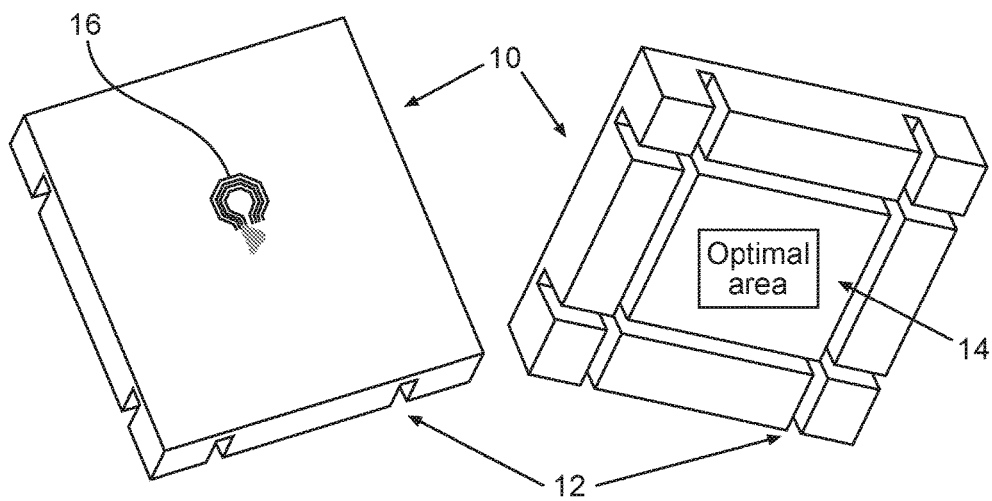
FIGS. 2a, 2b illustrate how metal plated trenches may be provided in a silicone substrate around an antenna element, and how it changes Gain of the antenna.

FIG. 2a schematically shows an exemplary optimal individual area 14 formed on an insulating board 10 by trenches 12 (for example, metallized trenches), for an antenna element 16 (in this example, a radiating source). The exemplary optimal area is found in the range which allows preserving the antenna's Gain, for example in the presence of neighboring antenna elements.

Figure 2B:
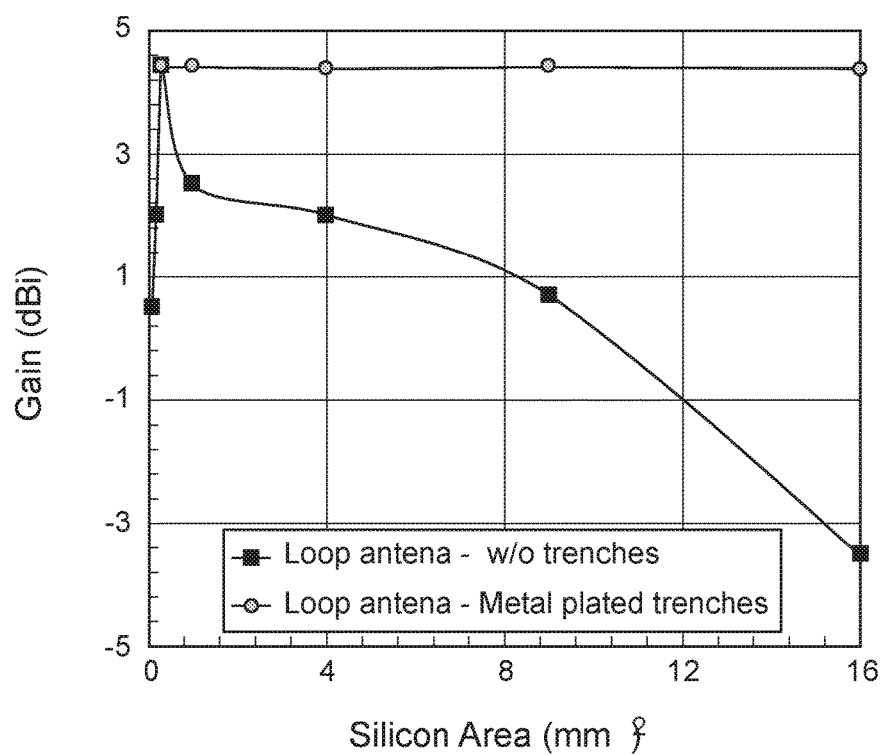

FIG. 2b shows electromagnetic simulation results of the silicon area variation and metal plated trenches impact on the antenna gain. Speaking about frequencies and parameters of the silicon substrate, the Inventors have realized that an optimal area for an antenna in an array can be found empirically, by detecting that the gain of the antenna in the array is stabilized and does not decrease due to the increased area/neighbor antennas. For example, the optimal area was achieved by the proposed technique in the following case: for frequencies from 250-350 GHz and for a silicon substrate with the following characteristics: relative permittivity equal to 11.9, resistivity of 12 ohms·cm. Dimensions of the optimal area depend on the antenna type. In the case of a loop antenna, that area is around 300×300 microns.

Through their research, the Inventors have shown that it is possible to design a high gain loop antenna (5-8 dBi gain) in a standard silicon technology (CMOS, Dielectric constant=12, resistivity=12 ohms·cm) when realized within an optimal silicon area. Depth of the channels/metal walls embedded in the silicon substrate may vary up to the depth maximally allowed by thickness of the substrate.

Results of computer simulation of FIG. 2b show that Gain of an antenna can be stabilized over any silicon area if the array is provided with metal plated trenches defining an individual (preferably, optimal) area for that specific antenna. As can be seen in FIG. 2b, the simulated gain of the on-chip antenna degrades dramatically with increase of silicon area without trenches, but remains constant with the trenches setting the pixel silicon area optimally. The stabilized Gain is shown as a horizontal upper line in FIG. 2b.

Figure 3A:
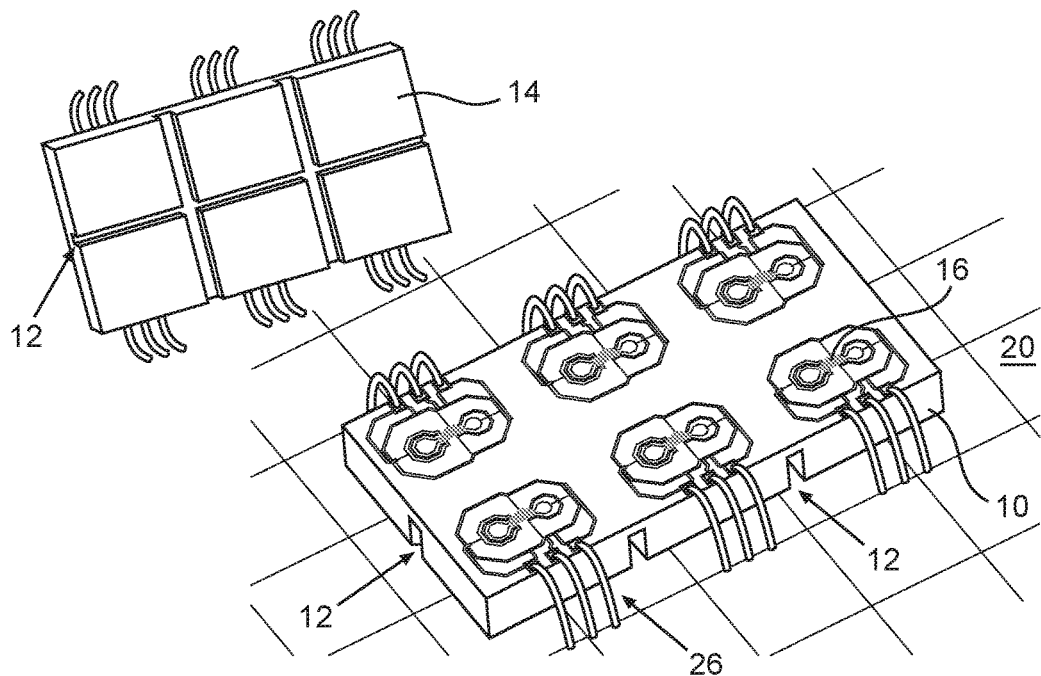
FIGS. 3a-c show a specific implementation of the antennas array (2×3), with corresponding parameters achieved by using the proposed trench/dicing technology.
Figure 3B:
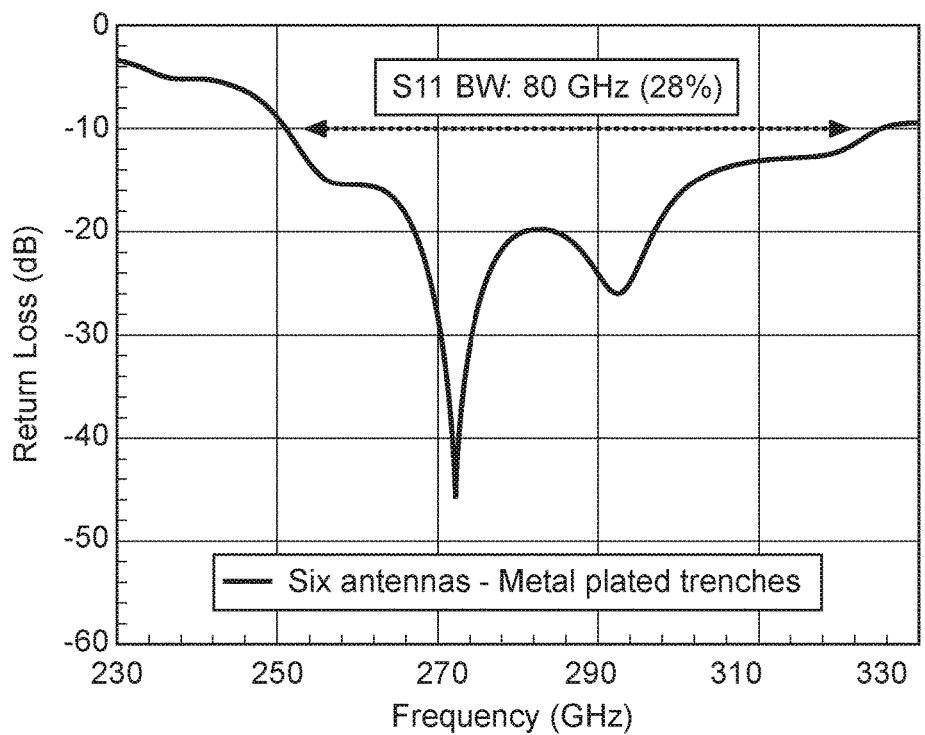
Figure 3C:
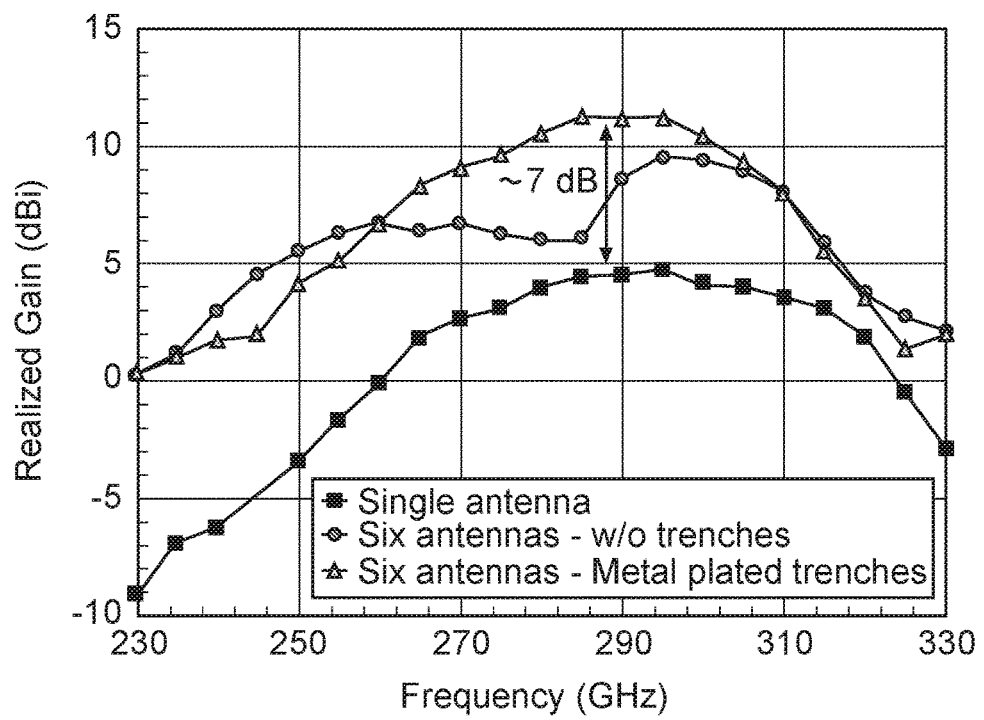

FIGS. 3a-c show an EM (electromagnetic) model of the antennas array (N×M), with corresponding S-parameters and realized Gain parameters achieved by using the proposed trench/dicing technology. According to the concept, a group of elements respectively comprising THz antennas, were arranged into a design of an N×M array (for example, a 2×3 array, but actually any array comprising two or more elements) on a silicon surface limited by available fabrication silicon area of a semiconductor wafer or PCB, while trenches (preferably, metal filled trenches) provided on the backside of the PCB plate so as to define an individual silicon area for each of the elements and separate the individual silicon areas from one another. The metal filled trenches enabled minimal interference between elements of the array and their optimum placement as a tradeoff between performance and silicon area cost.

For example, in 65 CMOS the Inventors' approach allows obtaining a record radiated power of +5.4 dBm at 0.3 THz using only a 2×3 on-chip array, EIRP of +22 dBm and 5.1% of radiated power to DC power, which is more than five times achieved for an array in any technology at these frequencies.

Therefore, the concepts proposed in this work will be further explained and illustrated using an example of a 300 GHz Wirelessly-Locked 2×3 Array Radiating +5.4 dBm with 5.1% DC-to-RF Efficiency in 65 nm CMOS (which has also been mentioned with reference to FIG. 1c).

The EM design of the exemplary antenna array (FIG. 3a) included the Voltage Controlled Oscillator (VCO) inductors 16, ground rings, PCB ground plane 20 and bond wires 26. The technological stages of packaging a 2×3 array on a die 10 may be as follows: 1) filling the trenches 12 with metal walls by impregnating the die/substrate of the chip 10 with a conductive glue, from backside of the die, when the chip is glued (for example with a silver epoxy conductive glue, not shown) on the PCB 20, 2) metallizing sides of the substrate, for example by the same conductive glue, and 3) bonding the chip with metal wires 26 to the PCB 13 (for example, at each pixel of the array). Using as a load the antenna S-parameters extracted from an EM simulator, the VCO was designed to oscillate around 285 GHz at the $3^{rd}$ harmonic. From simulation, the differential Colpitts oscillator is able to deliver up to 2.5 dBm at the drain (antenna) at 285 GHz. Based on simulation, an EIRP of +21-22 dBm was calculated. To lock the oscillators, the wireless injection technique presented in [14] was used.

FIG. 3b shows the return loss parameter (in dB) of the array of FIG. 3a (comprising six antennas on the substrate with metal plated trenches), depending on frequency (GHz). S-parameters indicate how well power is delivered to the antenna from a given source (VCO in our case). The antenna is 'matched' when S-parameters are high. As the return loss (which is identical to S11) is lower, it is better—more power is delivered to the antenna). S11 BW means what is the bandwidth (BW) in which the antenna is matched (i.e. power is delivered properly to the antenna). FIG. 3b shows that the "exemplary antenna" is matched between of about 250 and 325 GHz; S11 BW: 80 GHz (28%).

Simulation of FIG. 3c shows a realized gain of 11.2 dBi (40% efficiency) with a S11 bandwidth of 80 GHz (28%) around 285 GHz. (See the curve made by triangles, for the above-discussed 2×3 array). Compared to a single element (the curve made by rectangles), the discussed 2×3 array has a 7 dB increase being slightly lower than the theoretical maximum gain (7.8 dB). The curve made by circles shows the realized gain in the same array where trenches between pixels are not provided. As mentioned, the use of metal filled trenches enabled minimal interference between elements and their optimum placement as a tradeoff between performance and silicon area cost. Owing to separation of antenna elements, a very good quality of signals can be obtained, On such a basis, the signals may further be successfully pulled, synchronized and wirelessly locked.

Figure 4A:
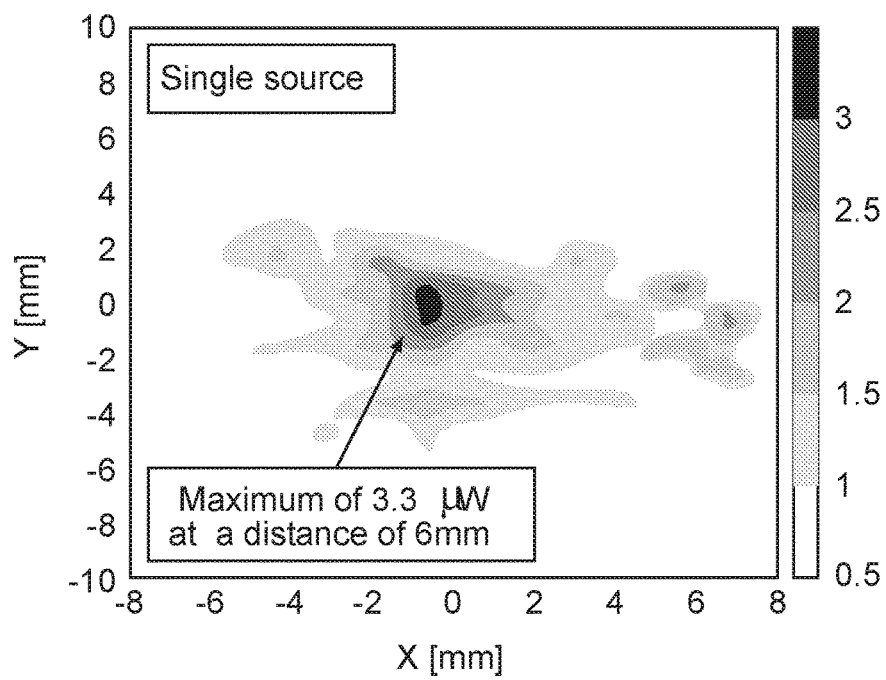
FIGS. 4a, b present scans showing Power of a single antenna, and Power of an array of 2×3 antennas.
Figure 4B:
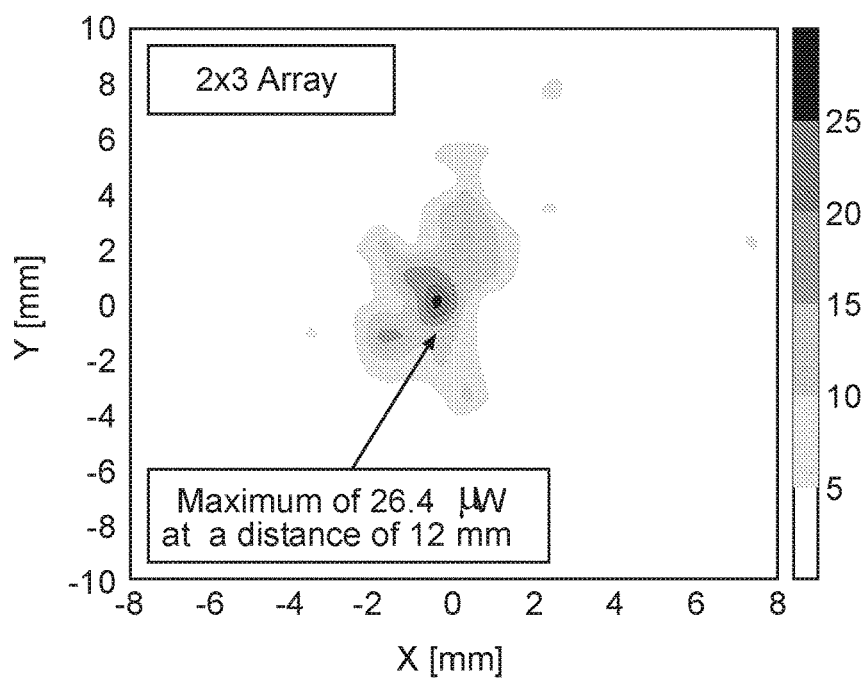
FIGS. 4c, shows a graph of EIRP as a function of frequency for a single antenna and an array of 2×3 antennas.
FIG. 4d shows a graph of EIRP/TRP as a function of number of antennas in the array.

FIGS. 4a, 4b show power scans of a single radiating source (FIG. 4a) and a 2×3 array of the sources (FIG. 4b). Scans of a single and of six pixels (i.e. elements or antennas) were made and TRP of −2.4 dBm and +5.4 dBm were measured, respectively. Very good fit with maximum theoretical array gain are observed for the TRP and EIRP. From the measured EIRP and TRP, the 2×3 pixels array has a directivity of 16.6 dBi. The 2×3 pixels array consumes in total 67.2 mW DC power consumption resulting in a record 5.1% radiated power DC-to-THz efficiency. The 2D 2×3 array occupies a square of about 2.22 mm².

Figure 4C:
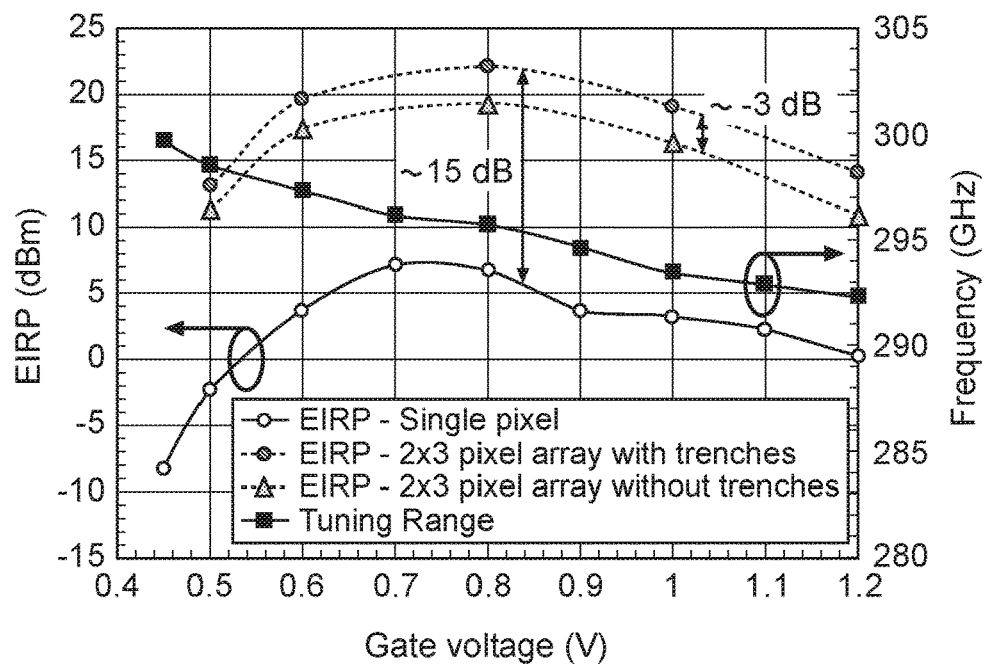

FIG. 4c shows the graphs of EIRP and Tuning Range as a function of the frequency and control Gate bias voltage (V) for a single antenna and for the 2×3 pixels array. The graphs are measurement results. It can be seen that parameters of the antennas array with trenches are significantly better than those of a single antenna element or an array without trenches. The EIRP graph of the array with trenches shows of about double efficiency of the array in comparison with that without trenches.

Figure 4D:
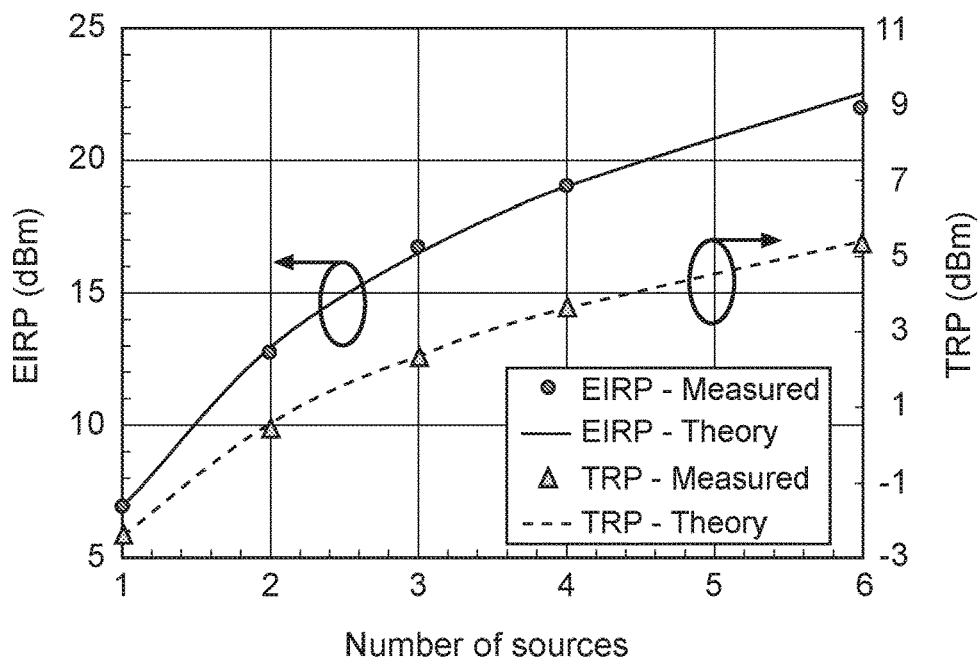

FIG. 4d shows the graph of EIRP/TRP as a function of the sources number. FIG. 4d shows that the theoretical and the measured values of TRP and EIRP actually coincide for the proposed array.

Figure 5A:
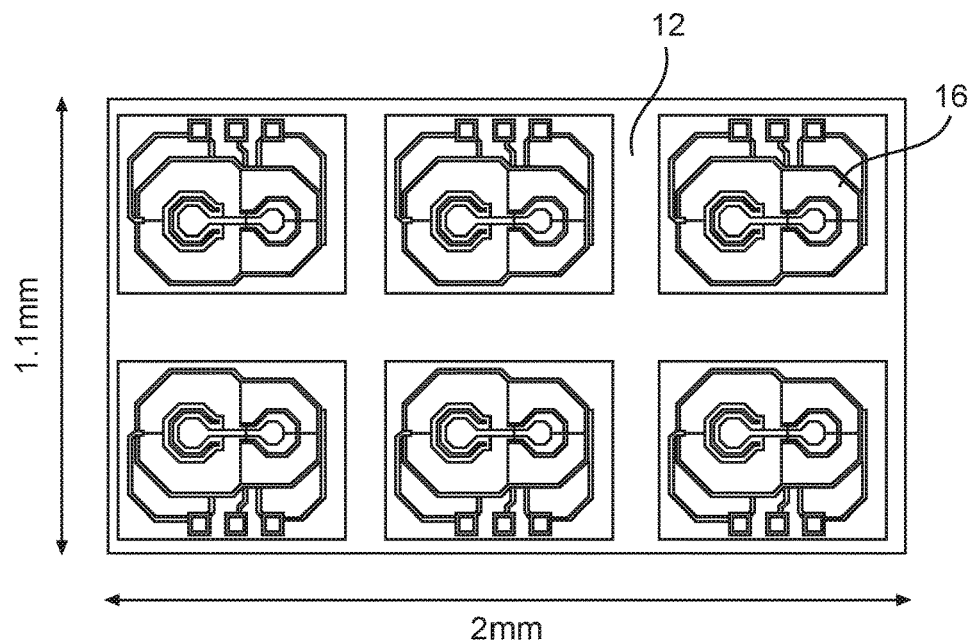
FIGS. 5a and 5b are micrographs of an exemplary chip with an array of 2×3 sources, provided with diced trenches isolating the sources.

FIG. 5a schematically illustrates a specific example of the 2×3 pixels array, which was realized using the TSMC 65 nm CMOS process with 230 µm silicon thickness.

Figure 5B:
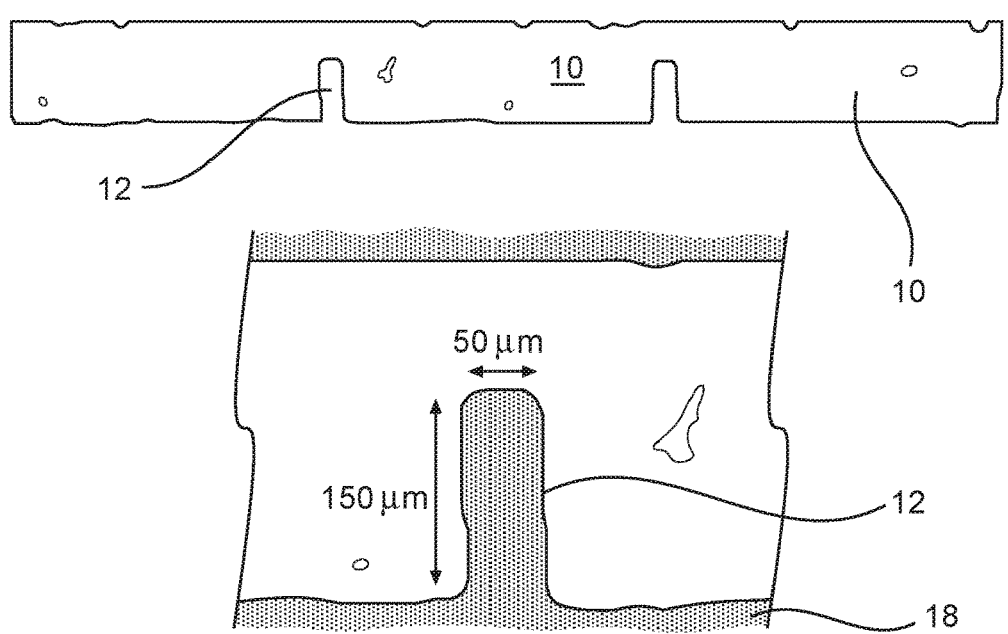

FIG. 5b presents a side view of the substrate and an enlarged cross-section of one trench. By using a blade dicer, trenches were provided on the backside of the die/wafer such as PCB. A 50 µm width blade was used and a depth dice of about 150 µm was realized which fulfills the isolation condition for efficient THz radiation without scarifying mechanical stability. To fill the trenches, the circuit was simply glued on a PCB with a conductive glue filling completely all the trenches, and then wire-bonded.

Figure 6A:
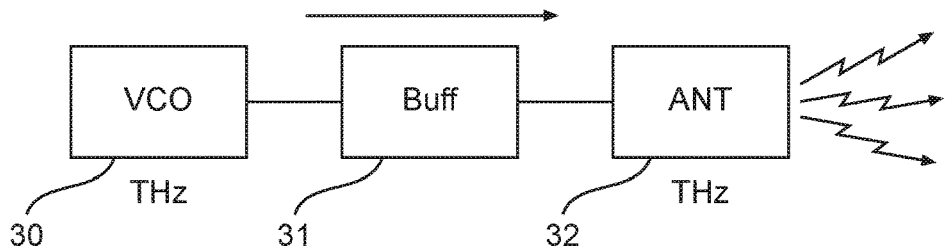
FIGS. 6 a, b, c, present schematic block diagrams illustrating:
an exemplary implementation of the proposed subharmonic wireless injection locking (FIG. 6b) in comparison with a known approach (FIG. 6a), and an example of performing mutual subharmonic locking in an array (FIG. 6c).

FIG. 6a schematically shows that in the prior art, a THz transmitter (radiating source, VCO) 30 is usually connected to an antenna 32 via a buffer circuit 31 which is rather complex and expensive; also, the antenna 32 works in the transmitting regime only, to radiate a desired transmitting frequency.

Figure 6B:
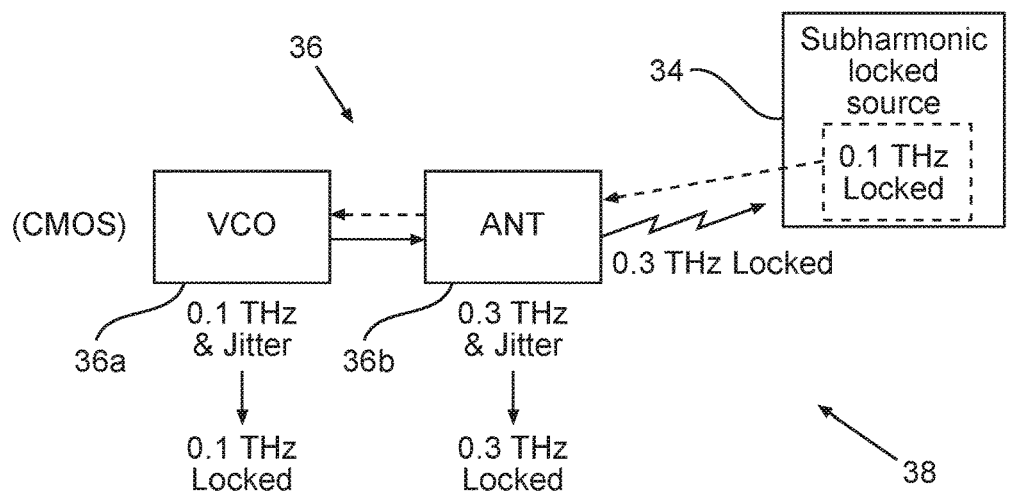

FIG. 6b schematically illustrates the inventive concept of frequency locking, using two exemplary values of frequencies. A locked THz transmitter (radiating source) 36 can be obtained using a rather cheap CMOS-based VCO 36a which basically generates a radiating/transmitting and a subharmonic frequencies with jitter (in this example, 0.3 THz and 0.1 Thz respectively). To lock it, an external source 34 of locked subharmonic frequency is provided. The VCO 36a is directly connected to its antenna 36b, and then so-called wireless injection locking of a subharmonic frequency of the VCO may be performed, using an external source 18 which is locked at that subharmonic frequency. The antenna 36b is adapted to receive that locked frequency from the external source 34. When the internal subharmonic frequency 0.1 THz of the VCO 14, circulating between the transmitter 36a and the antenna 36b, becomes locked owing to the effect of wireless injection from the external source 34, it also results in locking of the radiating frequency of the VCO, produced from the subharmonic frequency, and the radiating frequency 0.3 THz is transmitted from the antenna 36b. It should be noted that the antenna 36a may be adapted to transmit also the subharmonic frequency. An antenna element comprising a transmitter 36a and an antenna 36b is marked 36. A system comprising at least one element 36 and an external source 34 is marked 38.

Figure 6C:
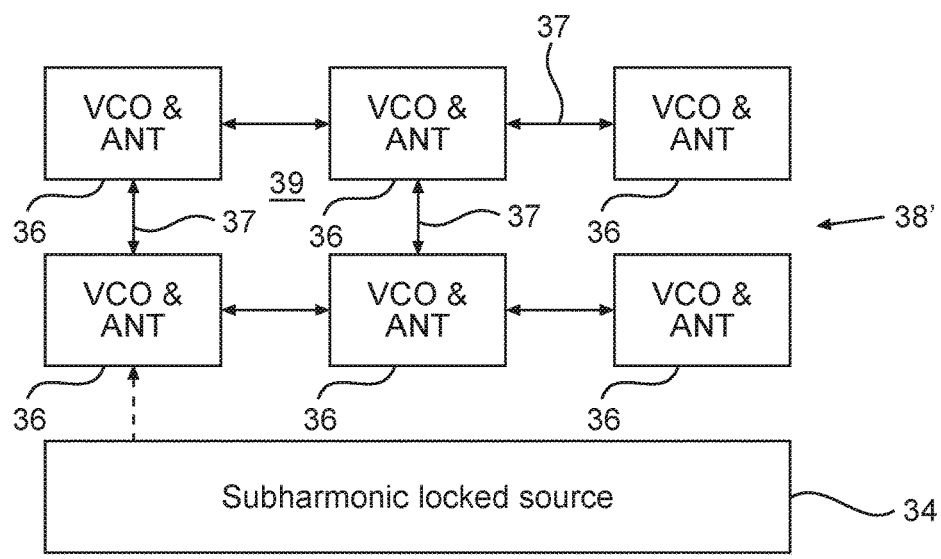

FIG. 6c shows one implementation of the inventive concept, where a number of elements 36 each comprising a VCO with antenna like that in FIG. 6b are arranged in an array 39 sufficiently close to one another, and when each of the elements is also capable of radiating the subharmonic frequency. The mutual locking (shown by arrows 37 between elements 36) enhances the locking effect of the external source (injector) 34 which may have a wide beam that will radiate at the whole array. FIG. 6c may be understood also as a system 38' illustrating the combined external and mutual wireless injection locking in the array 39.

Figure 7:
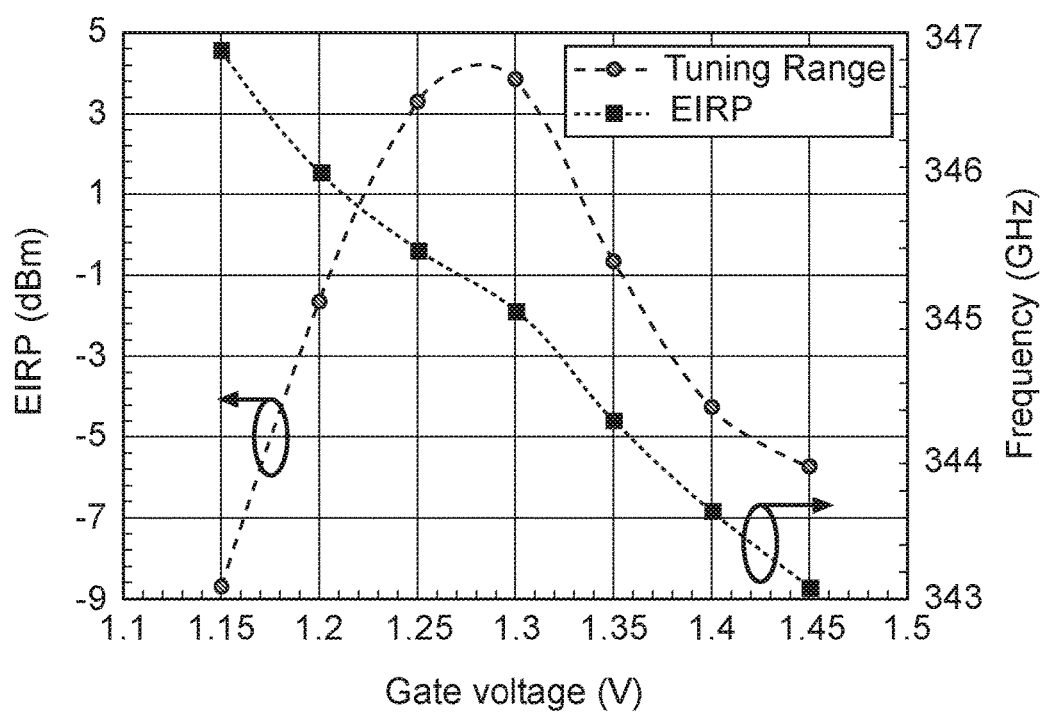
FIG. 7 shows the measurement results of the EIRP and of tuning range against the control Gate bias voltage in the proposed THz transmitter.

FIG. 7 shows the measurement results of the EIRP and of tuning range of a single antenna element against the control Gate bias voltage, wherein the antenna element is an antenna+the proposed THz transmitter, when injection locking is applied. To measure the circuit total radiated power, a maximum mechanically allowed scan of 15×16 mm2 at a distance of 4 mm was realized. The scan showed that the sum of all the radiated power collected in the scan area results in a directivity of 8.1 dBi and a total radiated power (TRP) of −4.3 dBm for a single element of the array. These results demonstrate advantages of the wireless injection locking in our VCO array.

Table 1 (below) is a combined generalized table where the main design factors of the proposed THz transmitter array are qualitatively compared with the corresponding main design factors of some known types of THz arrays. All the architectures are compared based on the same EIRP, i.e. normalized to the same EIRP value.

TABLE 1

| Frequency Synthesis Architecture (of an array) | Connection to Antenna | DC Consumption | Locked Signal | Complexity | Area | Cost |
|---|---|---|---|---|---|---|
| Active Multiplying Chain | MN | Very High | ✓ | High | Large | High |
| VCO + PLL | MN | Medium | ✓ | High | Medium | High |
| VCO | MN | Low | — | Low | Small | Low |
| VCO (this work) | None | Low | ✓ | Low | Small | Low |

"MN" - Matching Network, typically a transformer;
"Area" - area for fabrication

Table 2 (below) presents a comparison of the proposed solution for a THz source array with various known solutions described in references [4] and [10] to [14] from the list presented at the end of the description. By using post-processing metallized (metal plated) diced trenches at the die backside, a TRP of +5.4 dBm and EIRP of +22 dBm with 5.1% radiated DC-to-THz efficiency was achieved. The achieved radiated power and efficiency in this locked source is a record for integrated circuits of any technology above 200 GHz.

an improved antenna element. The Inventors suggested providing an antenna element (being a single one or an element of an array, for example being the proposed improved one) with its individual area on a silicon substrate/insulating board, by defining such an area by channels made in the substrate (and preferably, by further metallizing the channels). Though CMOS VCO was previously considered unsuitable for locking THz band frequencies, the Inventors have shown that the proposed method surprisingly allows efficiently locking THz band frequencies of such CMOS-

TABLE 2

| Reference | JSSC 2012 [4] | ISSCC 2014 [10] | ISSCC 2015 [11] | ISSCC 2013 [12] | IMS 2015 [13] | RFIC 2015 | This Work |
|---|---|---|---|---|---|---|---|
| Freq. (GHz) | 280 | 338 | 317 | 260 | 400 | 345 | 296 |
| Tuning Range (%) (a) | 3.2 | 2.1 | — | 1.4 | 7.7 | 1.1 | 2.4 |
| EIRP (dBm) | 9.4 | 17.1 | 22.5[b] | 15.7[b] | 5(c) | 13.8 | 22 |
| TRP (dBm) | −7.2 | −0.9 | 5.2(b) | 0.5(b) | — | 1 | 5.4 |
| DC consuption (mW) | 820 | 1540 | 610[d] | 800 | 1400[d] | 105[d] | 67.2[d] |
| DC-to-RF Eff. | 0.023 | 0.053 | 0.54[b] | 0.14[b] | — | 1.2 | 5.15 |
| Beam Steering (° per direction) | 80/80 | 45/50 | — | — | 70/0 | — | 26/21 |
| Array Type | 4×4 | 4×4 | 4×4 | 2×4 | 1×8 | 1×4 | 2×3 |
| Architecture | Coupled VCOs | Coupled VCOs | PLL | Coupled VCOs | X4 mult. | IL VCOs | IL VCOs |
| Locked signal | No | No | Yes | No | Yes | Yes | Yes |
| Nominal Voltage (V) | 1.1 V | 1.4 V | 2.3 V | 1.2 V | 1.4 V | 1.2 V | 1.4 V |
| Technology | 45 nm CMOS | 65 nm CMOS | 130 nm SiGe | 65 nm CMOS | 45 nm CMOS | 65 nm CMOS | 65 nm CMOS |
| Silicon area (mm²) | 7.29 | 3.9 | 2.08 | 2.25 | 10.5 | 0.71 | 2.22 |

[a]−3 dB bandwidth for multiplying chains.
[b]Use of a silicon lens.
[c]Use of a superstrate quartz.
[d]Does not take into account the DC power consumption of the external locked reference.

The developed concept allows the realization of a scalable THz source array at low cost. Also, it has been demonstrated that the high gain property of antennas in arrays can be achieved for frequencies around 270-350 GHz. However, it can be realized over a much larger frequency spectrum (at least 200-700 GHz, according to the present research).

Advantages of the solution proposed by the Inventors will be discussed below, referring to specific examples, when applicable.

The Inventors suggested using a VCO manufactured by CMOS technology, which, being widely spread and relatively cheap, provides advantages (see below). The inventors suggested directly connecting the VCO with a suitable antenna, (which can also be made by CMOS), thus creating based VCOs. For example, the use of a subharmonic frequency of a CMOS-based transmitter/VCO allows working in the range of frequencies lower than $f_{max}$ of VCO, so the problem of low transmitted Gain does not exist in the inventive solution.

Further, the use of quite a low power, subharmonic frequency locking signal from a remote source working in free space allows obtaining a robust transceiver with a locked THz gap transmitting frequency. Such a transceiver does not require expensive and bulky PLL circuits and/or multiplying schemes, and has very low DC power consumption. More specifically, the proposed approach for injection locking of radiating THz CMOS VCOs alleviates the need for an integrated PLL and allows injection locking without lowering the tank Q, thus preserving the source high output power. For example, wide tuning of 280-294 GHz is demonstrated with up to +7 dBm of EIRP and 0.6 mW of total radiated power from a single element with 3% of radiated power efficiency. The new approach can further be applied to simultaneous wireless injection locking of radiating THz CMOS arrays, saving the required silicon area and DC power consumption and removing the need of complex high frequency distribution networks.

The proposed trenches/channels allow facile design of both the antenna and the rest of the circuit, since they are decoupled by the trenches. In literature, it is usually reported over arrays in these frequencies. Still, relevant results are around +3 dBm EIRP and 0.05 mW total radiated power. Also, a most relevant figure is the efficiency (DC-to-RF energy conversion, measured in %)—there people report around 0.14 and 0.015%, whereas the proposed invention has around 1.2% (or higher). Trenches increase the antenna performance and, consequently, the overall performance of the chip.

The novel approach, upon being applied to an array of the described radiating sources, has demonstrated that a combination of mutual (inter-chip) and external reference locking effects is an extremely powerful technique for synthesizing a locked source, with high EIRP, TRP, low DC consumption, and minor circuit complexity. By combining the possibility to lock both frequency and phase, both directivity and TRP of the array are increased, compared to a single element. For example, a maximum EIRP/TRP of +13.8/+1 dBm at 345 GHz from a 1×4 VCO array is demonstrated, with a locked output signal, and the effect could be scaled up to large 2D arrays.

The important advantage of the present invention is that the proportion between the required expenses and the obtained power and accuracy of the output THz signal is much more favorable than in other existing solutions for the THz gap, mentioned in the background.

The costs involved in designing & manufacturing such systems having desired parameters differ approximately by 500 times between the known existing methods and the proposed technique (for example, 500, 000 USD for existing methods and 5,000 USD for the proposed method.)

It should be understood that other versions and implementations of the proposed method, system and antenna/antennas' array may be proposed, and they are to be considered part of the invention, whenever defined by the claims which follow (after the list of references).

REFERENCES

[1] H. Ruonan, E. Afshari, "A 260 GHz broadband source with 1.1 mW continuous-wave radiated power and EIRP of 15.7 dBm in 65 nm CMOS," IEEE International Solid-State Circuits Conference (ISSCC), pp. 138-139, February 2013.
[2] S. Jameson, E. Socher, "High Efficiency 293 GHz Radiating Source in 65 nm CMOS," IEEE Microwave and Wireless Components Letters, vol. 24, no. 7, pp. 463-465, July 2014.
[3] P.-Y. Chiang, Z. Wang, O. Momeni and P. Heydari, "A Silicon-Based 0.3 THz Frequency Synthesizer With Wide Locking Range", IEEE Journal of Solid-State Circuits, Vol. 49, No. 12, December 2014.
[4] K. Sengupta and A. Hajimiri, "A 0.28 THz power generation and beam-steering array in CMOS based on distributed active radiators", IEEE Journal of Solid-State Circuits, vol. 47, no. 12, pp. 3013-3031, December 2012.
[5] F. Golcuk, O. Dogan, G. M. Rebeiz, "A 0.39-0.44 THz 2×4 Amplifier-Quadrupler Array With Peak EIRP of 3-4 dBm", IEEE Trans. Microwave Theory & Tech., Vol. 61, No. 12, pp. 4483-4491, December 2013.
[6] M. Adnan, E. Afshari, "A 247-to-263.5 GHz VCO with 2.6 mW peak output power and 1.14% DC-to-RF efficiency in 65 nm Bulk CMOS," IEEE International Solid-State Circuits Conference (ISSCC), pp. 262-263, February 2014.
[7] Z. Chen, C.-C. Wang, H.-C. Yao and P. Heydari, "A BiCMOS W-Band 2×2 Focal-Plane Array With On-Chip Antenna", IEEE Journal of Solid-State Circuits (JSSC), vol. 47, no. 10, pp. 2355-2371, September 2012.
[8] K. Statnikov, E. Öjefors, J. Grzyb, P. Chevalier and U. R. Pfeiffer, 0.32 THz FMCW Radar System Based on Low-Cost Lens-Integrated SiGe HBT Front-Ends", IEEE European Solid State Circuits Conf. (ESSCIRC), pp. 81-84, September 2013.
[9] B. Razavi, "A study of injection pulling and locking in oscillators," IEEE Journal of Solid-State Circuit (JSSC), vol. 39, no. 9, pp. 1415-1424, September 2004.
[10] Y. Tousi, et al., "Scalable THz 2D phased array with +17 dBm of EIRP at 338 GHz in 65 nm bulk CMOS," ISSCC Dig. Tech. Papers, February 2014.
[11] R. Han, et al., "A 320 GHz phase-locked transmitter with 3.3 mW radiated power and 22.5 dBm EIRP for heterodyne THz imaging systems", ISSCC Dig. Tech. Papers, February 2015.
[12] R. Han, et al., "A 260 GHz broadband source with 1.1 mW continuous-wave radiated power and EIRP of 15.7 dBm in 65 nm CMOS", ISSCC Dig. Tech. Papers, February 2013.
[13] Y. Yang, et al., "An 8-Element 400 GHz Phased-Array in 45 nm CMOS SOI", IEEE IMS, May 2015.
[14] S. Jameson, et al., "Sub-harmonic wireless injection locking of a THz CMOS chip array", IEEE RFIC, May 2015.

The invention claimed is:

1. An antenna chip, comprising one or more antenna elements placed on an insulating board and capable of radiating and/or receiving frequency, wherein each of said antenna elements is positioned on its individual area on the board, wherein each said individual area is defined by channels provided in the insulating board, wherein the channels are separate from the antenna element, and wherein said insulating board is a silicon substrate.

2. An antenna chip, comprising one or more antenna elements placed on an insulating board and capable of radiating and/or receiving frequency, wherein each of said antenna elements is positioned on its individual area on the board, wherein each said individual area is defined by channels provided in the insulating board, and wherein said frequency is around the THz gap.

3. The antenna chip according to claim 2, wherein said antenna elements are placed on a front surface of the substrate, and wherein said channels are diced in the back surface of the board and filled with a conductive material.

4. The antenna chip according to claim 2, wherein said channels are formed using Through Substrate Vias (TSV) provided in the substrate.

5. The antenna chip according to claim 2, wherein said individual area is an optimal area being such that for an antenna element being provided with said optimal area in said array, gain remains non-degraded in operation.

6. The antenna chip of claim 2, wherein said channels are metallized.

7. The antenna chip according to claim 2, wherein said antenna element on the board is manufactured by 65 nm CMOS technology.

8. The antenna chip according to claim 3, wherein said channels are metallized by a conductive glue.

9. The antenna chip according to claim 2, comprising a 2D, 2×3 array of said antenna elements capable of radiating 0.3 THz frequency and provided by 65 nm CMOS on a front surface of a chip, wherein said area being divided into individual areas, for each of said antenna elements, by trenches provided on a back surface of the board and filled by a conductive material.

10. The antenna chip according to claim 2, said antenna elements comprise an antenna element being a transmitter with a THz antenna adapted to receive an external subharmonic frequency from an external source, wherein dimensions of the individual area of said transmitter approximately correspond to cross-section of a beam radiated by said external source, while received at the individual area.

11. A method of manufacturing the antenna chip according to claim 2, the method comprising
a step of providing, on the insulating board, one or more said antenna elements capable of radiating and/or receiving frequency, and
a step of providing the channels in the insulating board so as to define by said channels said respective individual area on the insulating board for each of said antenna elements.

12. A system for locking a signal of THz transmitting frequency, said system comprising:
an antenna element being a transmitter with a THz antenna adapted to receive an external subharmonic frequency,
wherein said system is configured to perform wireless injection locking in said transmitter by said external frequency being locked and being subharmonic in respect of the transmitting THz frequency of the transmitter; and
wherein the system thereby ensures locking of said transmitting THz frequency of said transmitter.

13. The system according to claim 12, wherein said system is configured for locking the transmitting THz frequency of the transmitter, being THz gap frequency.

14. The system according to claim 12, further comprising an external source of the locked subharmonic frequency.

15. The system according to claim 12, comprising:
the antenna element being the transmitter provided with the THz antenna and being configured for:
producing at least a first frequency of N THz, and
receiving a second, subharmonic frequency of N/n THz, wherein n is natural;
transmitting a third frequency being equal to or higher than the first frequency,
wherein the external source is configured for emitting a locked frequency of N/n THz being equal to the second frequency of the transmitter;
wherein the transmitter and the source are arranged in space so that whenever being initiated, the transmitter is exposed to radiation of the source, and thus is subjected to wireless injection locking at its second frequency of N/n THz, thereby one or more frequencies of the transmitter become locked due to the locked second frequency; the first transmitter is thereby enabled to output at least said third locked frequency being said transmitting THz frequency.

16. The system according to claim 12, wherein the transmitter is a CMOS VCO, and the THz antenna is an on-chip ring antenna directly connected to the VCO.

17. The system according to claim 12, comprising an array of two or more of said antenna elements.

18. The system according to claim 17, wherein a distance between adjacent antenna elements in said array is in the range of about (0.5-2.0) of the subharmonic or fundamental frequency wavelength.

19. A method for locking signals of THz frequency using the system according to claim 12, the method comprising:
providing said system comprising the antenna element being a transmitter with the THz antenna adapted both to transmit a THz transmitting frequency, and to receive an external frequency being subharmonic in respect of said THz transmitting frequency;
providing said external locked frequency, and
performing the wireless injection locking of the transmitter by subjecting said THz antenna to said external locked frequency, thereby obtaining said THz transmission frequency locked.

20. A THz frequency antenna element configured for transmitting and receiving THz gap frequencies, and manufactured by a CMOS technology, comprising a transmitter having a VCO topology and being directly connected to an antenna.

21. The antenna element according to claim 20, wherein the antenna is configured for at least a two-fold function comprising:
receiving a subharmonic frequency for performing wireless injection locking of the transmitter; and
transmitting a working frequency being a superharmonic working frequency with respect to said subharmonic locked frequency.

22. The antenna element according to claim 20, wherein the antenna is configured to operate in the following two regimes depending on the frequency:
at the subharmonic frequency, the antenna is an inductor and acts as an RF-choke;
at the transmitting frequency, the antenna works as a matched resistive antenna.

23. The antenna chip according to claim 2, wherein the antenna element is a THz frequency antenna element manufactured by a CMOS technology and comprising an antenna directly connected to a transmitter having a VCO topology.

24. The antenna chip according to claim 2, wherein said antenna element comprises a transmitter connected to an antenna, and wherein said antenna element is adapted to perform a wireless injection locking of its transmitter by using an external locked frequency being subharmonic of a desired THz transmitting frequency of the transmitter, thereby obtaining said THz transmitting frequency locked.

25. The system for locking a signal of THz transmitting frequency according to claim 12, wherein said antenna element being placed within its individual area defined on an insulating board by channels provided in the insulating board.

26. The system according to claim 25, wherein said antenna element is part of an array of similar antenna elements each positioned on its individual area defined by said channels provided in the insulating board and metallized.

* * * * *